(12) United States Patent
Kruizinga et al.

(10) Patent No.: US 8,559,108 B2
(45) Date of Patent: Oct. 15, 2013

(54) GRATING FOR EUV-RADIATION, METHOD FOR MANUFACTURING THE GRATING AND WAVEFRONT MEASUREMENT SYSTEM

(75) Inventors: Borgert Kruizinga, Zoetermeer (NL); Martijn Gerard Dominique Wehrens, Waalre (NL); Michiel David Nijkerk, Amsterdam (NL); Kornelis Frits Feenstra, Cuijk (NL)

(73) Assignee: ASML Netherlands B.V., Veldhoven (NL)

( * ) Notice: Subject to any disclaimer, the term of this patent is extended or adjusted under 35 U.S.C. 154(b) by 487 days.

(21) Appl. No.: 12/809,744

(22) PCT Filed: Dec. 19, 2008

(86) PCT No.: PCT/NL2008/050836
§ 371 (c)(1),
(2), (4) Date: Jun. 21, 2010

(87) PCT Pub. No.: WO2009/082224
PCT Pub. Date: Jul. 2, 2009

(65) Prior Publication Data
US 2010/0284064 A1    Nov. 11, 2010

Related U.S. Application Data

(60) Provisional application No. 61/008,573, filed on Dec. 21, 2007.

(51) Int. Cl.
*G02B 5/18* (2006.01)
*G06K 7/10* (2006.01)
(52) U.S. Cl.
USPC .......................................... 359/572; 359/350

(58) Field of Classification Search
USPC ............... 359/566, 569, 350, 572; 355/53, 71
See application file for complete search history.

(56) References Cited

U.S. PATENT DOCUMENTS

| 6,392,792 | B1 | 5/2002 | Naulleau ........................ 359/360 |
| 6,650,399 | B2 | 11/2003 | Baselmans et al. |
| 2002/0145717 | A1 | 10/2002 | Baselmans et al. |
| 2003/0180632 | A1* | 9/2003 | Eurlings et al. ................... 430/5 |

(Continued)

FOREIGN PATENT DOCUMENTS

| CN | 1448784 | 10/2003 |
| JP | 05-134385 | 5/1993 |

(Continued)

OTHER PUBLICATIONS

Notification Concerning Transmittal of International Preliminary Report on Patentability mailed Jul. 1, 2010 in corresponding International Application No. PCT/NL2008/050836.

(Continued)

*Primary Examiner* — Alessandro Amari
*Assistant Examiner* — Kimberly N Kakalec
(74) *Attorney, Agent, or Firm* — Pillsbury Winthrop Shaw Pittman LLP

(57) ABSTRACT

A grating for EUV-radiation includes a plurality of reflecting lines. Each reflecting line includes a plurality of first reflecting dots, and a plurality of second reflecting dots arranged between each other. The first reflecting dots and the second reflecting dots are configured to reflect EUV-radiation with a mutual phase difference of 180±10 degrees mod 360 degrees.

20 Claims, 23 Drawing Sheets

(56) References Cited

U.S. PATENT DOCUMENTS

| | | | |
|---|---|---|---|
| 2004/0145714 A1 | 7/2004 | Poultney | 355/55 |
| 2005/0146700 A1* | 7/2005 | Poultney | 355/55 |
| 2007/0153295 A1 | 7/2007 | Poultney | 356/521 |

FOREIGN PATENT DOCUMENTS

| | | |
|---|---|---|
| JP | 06-177016 | 6/1994 |
| JP | 2002-334831 | 11/2002 |
| JP | 2004-219423 | 8/2004 |
| JP | 2005-079592 | 3/2005 |
| JP | 2005-515481 | 5/2005 |
| JP | 2006-514441 | 4/2006 |
| JP | 2008-209873 | 9/2008 |
| JP | 2009-141223 | 6/2009 |

OTHER PUBLICATIONS

Chinese Office Action for Chinese Patent Application No. 200880121899.5, mailed on Jun. 29, 2012.

International Search Report as issued for PCT/NL2008/050836, dated Apr. 6, 2009.

Japanese Office Action mailed Nov. 16, 2012 in corresponding Japanese Patent Application No. 2010-539337.

* cited by examiner

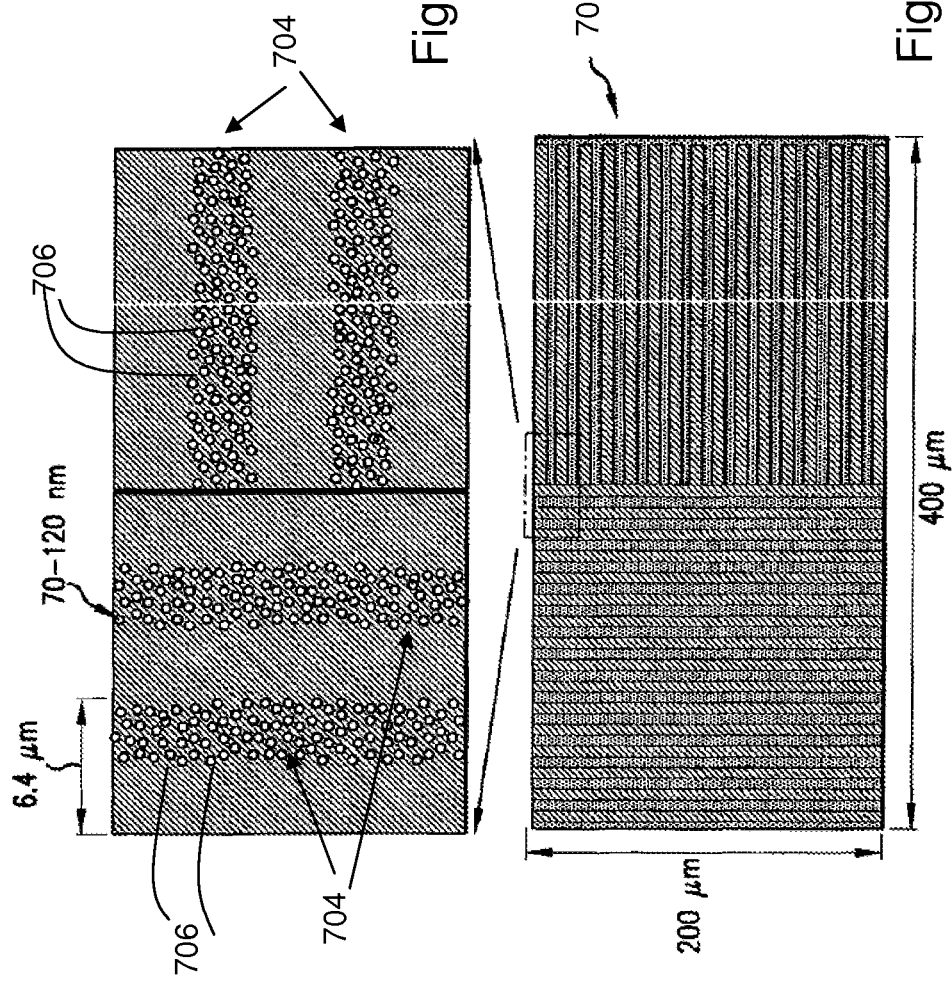

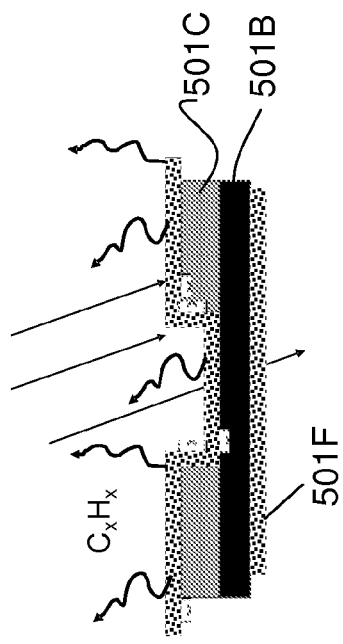
Figuur 14A
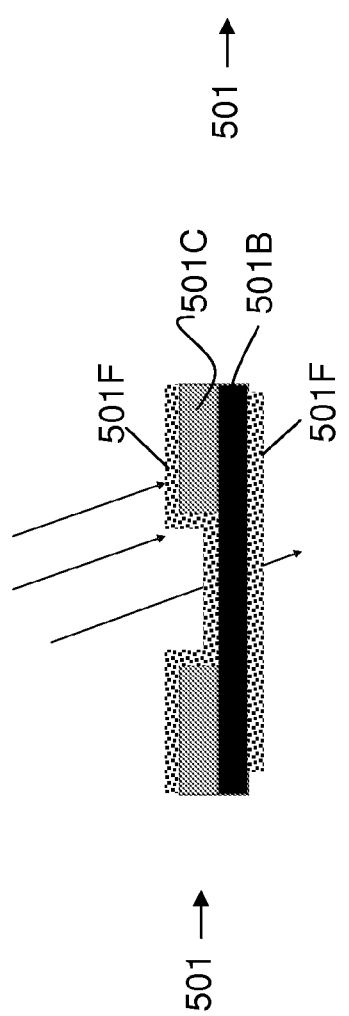
Figure 14B
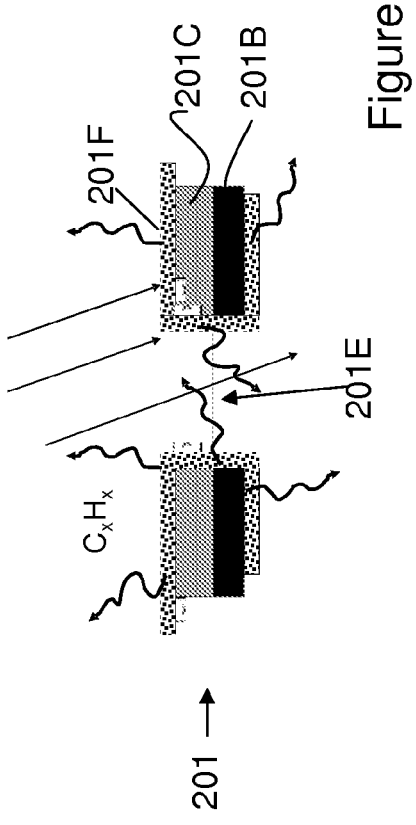
Figure 14C

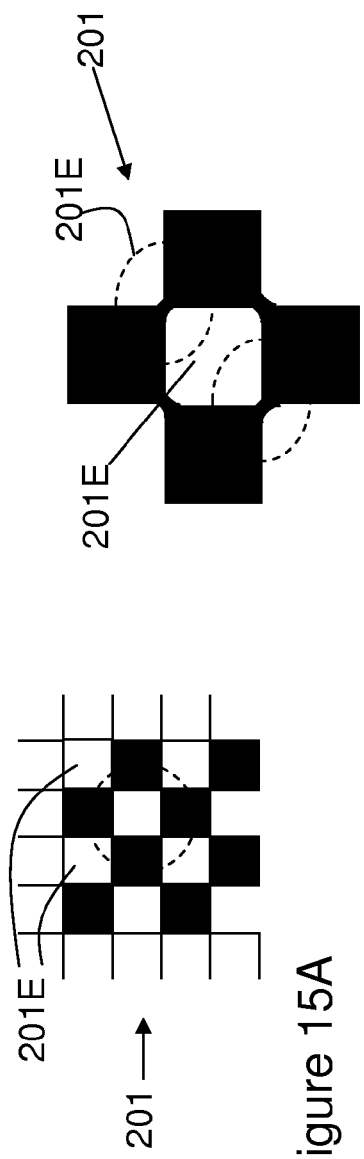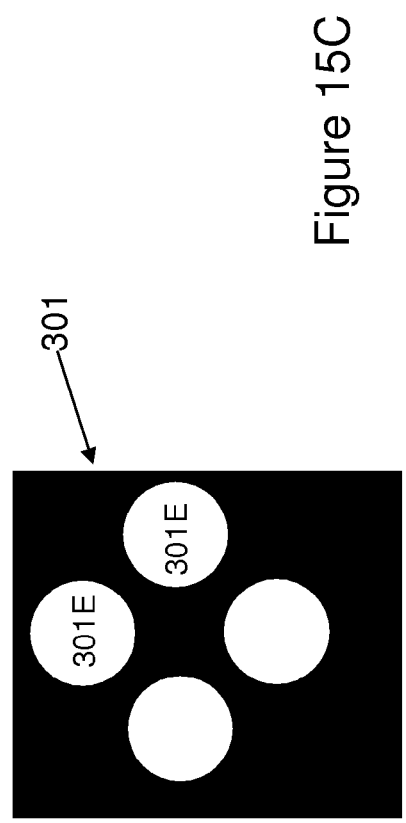
Figure 15A
Figure 15B
Figure 15C

GRATING FOR EUV-RADIATION, METHOD FOR MANUFACTURING THE GRATING AND WAVEFRONT MEASUREMENT SYSTEM

CROSS-REFERENCE TO RELATED APPLICATIONS

This application is the U.S. National Phase application of International Application No. PCT/NL2008/050836, filed Dec. 19, 2008, which claims priority from U.S. Provisional Patent Application No. 61/008,573, filed Dec. 21, 2007, the content of which is incorporated herein by reference in its entirety.

FIELD

The invention relates to a grating for EUV-radiation, a method for manufacturing the grating, and a wavefront measurement system, e.g. for a lithographic apparatus comprising the grating.

BACKGROUND

Lithography is a process used to create features on the surface of substrates. Such substrates can include those used in the manufacture of flat panel displays, circuit boards, various integrated circuits (ICs), and the like. A frequently used substrate for such applications is a semiconductor wafer. One skilled in the relevant art will recognize that the description herein also applies to other types of substrates. In such a case, the patterning structure may generate a circuit pattern corresponding to an individual layer of the IC, and this pattern can be imaged onto a target portion (e.g. comprising one or more dies) on a substrate (e.g., a silicon wafer) that has been coated with a layer of radiation-sensitive material (e.g., resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (with M<1) the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (e.g., resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are desired, then the whole procedure, or a variant thereof, should be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". The position of a second element traversed by the projection beam relative to a first element traversed by the projection beam will for simplicity hereinafter be referred to as "downstream" of or "upstream" of said first element. In this context, the expression "downstream" indicates that a displacement from the first element to the second element is a displacement along the direction of propagation of the projection beam; similarly, "upstream" indicates that a displacement from the first element to the second element is a displacement opposite to the direction of propagation of the projection beam. Further, the lithographic apparatus may be of a type having two or more substrate tables (and/or two or more mask tables). In such "multiple stage" devices, the additional tables may be used in parallel, or preparatory steps may be carried out on one or more tables while one or more other tables are being used for exposures. Dual stage lithographic apparatus are described, for example, in U.S. Pat. No. 5,969,441 and International Patent Application Publication No. WO 98/40791, incorporated herein by reference.

There is a desire to integrate an ever-increasing number of electronic components in an IC. To realize this it is desirable to decrease the size of the components and therefore to increase the resolution of the projection system, so that increasingly smaller details, or line widths, can be projected on a target portion of the substrate. For the projection system this means that the projection system and the lens elements used in the projection system should comply with very stringent quality requirements. Despite the great care taken during the manufacturing of lens elements and the projection system, they both may still suffer from wave front aberrations, such as, for example, displacement, defocus, astigmatism, coma and spherical aberration across an image field projected with the projection system onto a target portion of the substrate. The aberrations are sources of variations of the imaged line widths occurring across the image field. The imaged line widths at different points within the image field should be constant. If the line width variation is large, the substrate on which the image field is projected may be rejected during a quality inspection of the substrate. Using techniques such as phase-shifting masks, or off-axis illumination, the influence of wave front aberrations on the imaged line widths may further increase.

During manufacture of a lens element, it may be advantageous to measure the wave front aberrations of the lens element and to use the measured results to tune the aberrations in this element or even to reject this element if the quality is not sufficient. When lens elements are put together to form the projection system it may again be desirable to measure the wave front aberrations of the projection system. These measurements may be used to adjust the position of certain lens elements in the projection system in order to minimize wave front aberrations of the projection system.

After the projection system has been built into a lithographic projection apparatus, the wave front aberrations may be measured again. Moreover, since wave front aberrations are variable in time in a projection system, for instance, due to deterioration of the lens material or lens heating effects from local heating of the lens material, it may be desirable to measure the aberrations at certain instants in time during operation of the apparatus and to adjust certain movable lens elements accordingly to minimize wave front aberrations. It may be desirable to measure the wave front aberrations frequently due to the short time scale on which lens-heating effects may occur.

United States Patent Application Publication No. 2002/0145717 describes a wavefront measurement method that uses within the lithographic apparatus a grating, a pinhole and a detector, e.g. CCD detector. The detector may have a detector surface substantially coincident with a detection plane that is located downstream of the pinhole at a location where a spatial distribution of the electric field amplitude of the projection beam is substantially a Fourier Transformation of a spatial distribution of the electric field amplitude of the projection beam in the pinhole plane. With this measurement system built into the lithographic projection apparatus it is possible to measure in situ the wave front aberration of the projection system.

As illustrated in FIG. 1A, in this measurement system a component, plane wave $PW_{10}$ of wave W1 is diffracted by the grating as an emanating wave WD. The wave WD emanating from the grating can be considered as a sum of diffracted plane waves $PW_{2i}$, [i=0, 1, 2 . . . ]. The plane waves $PW_{22}$, $PW_{20}$ and $PW_{21}$ are, respectively, the +1st, 0th and −1st diffracted order of the incoming wave $PW_{10}$. In the projection system schematically shown in FIG. 1B the plane waves $PW_{2i}$, [i=0, 1, 2 . . . ] will focus near or at the pupil plane PU, and sample the pupil plane in three points. The aberrations of the projection system PL can be thought of as phase errors that are endowed on the focused plane waves $PW_{2i}$, [i=0, 1, 2 . . . ] in the pupil plane PU. These focused plane waves will exit the lens as plane waves $PW_{3i}$, [i=0, 1, 2 . . . ], respectively. As shown in FIG. 1C, to measure the phase errors representative for the lens aberrations, the plane waves $PW_{3i}$, [i=0, 1, 2 . . . ] are directionally recombined by diffraction at the pinhole 17 in a pinhole plate 11. For instance, $PW_{400}$ is the $0^{th}$ order diffracted wave originating from $PW_{30}$, $PW_{411}$ is the $+1^{st}$ order diffracted wave from $PW_{31}$ and $PW_{422}$ is the $-1^{st}$ order diffracted wave originating from $PW_{32}$ and these directionally recombined waves can interfere. Their interference intensity is harmonic with the phase stepping of the grating. Other recombination's of diffracted waves originating from the $PW_{3i}$ [i=0.1.2 . . . ], are possible as well. However, the intensity resulting from the interference of such recombination varies as a higher harmonic of the phase stepping movement of the grating. Such higher order harmonic signals can be filtered out from each CCD-pixel signal.

It is desirable to further reduce the size of the structures obtained by lithography. Therein the wavelength of the radiation may play an essential role. The shorter the wavelength, the more transistors can be etched onto the silicon wafer. A silicon wafer with many transistors may result in a more powerful, faster microprocessor. In order to enable processing with light of a shorter wave length, chip manufacturers developed a lithography process known as Extreme Ultraviolet Lithography (EUVL). In this process, transparent lenses are replaced by mirrors. U.S. Pat. No. 6,867,846 describes a phase shift mask for measuring wave front aberrations in such a process.

According to the method described therein, schematically shown in FIG. 3, the projection optical system PO projects an image of the first grating 203 at a second grating 201 that is positioned in its focal plane. Analogous to the method described in United States Patent Application Publication No. 2002/0145717, the second grating recombines diffracted waves. Wave front aberrations caused by the optical system PO become visible as an interference pattern, which can be inspected by a wave front sensor 106, such as a CCD-camera.

A particular problem that frequently exists in many EUV photolithographic systems is that the EUV source does not provide uniform information, but instead has a number of facets, or hot spots in its exit pupil that result from use of fly's eye lenses in the optics of the EUV source. This results in a non-uniform wavefront at the input numerical aperture of the pupil of the projection optics, or sometimes, in underfilled numerical aperture of the projection optics. These problems may affect the measurement of the wavefront by the wavefront sensor discussed above.

Thus, it is desirable to be able to eliminate the underfilling and intensity nonuniformity at the input numerical aperture of the projection optics. Accordingly, the phase shift mask additionally serves to condition the illumination reaching the input numerical aperture pupil plane of the projection optics PO. The phase shift mask washes out spatial variations introduced by the source, so that the pupil plane is substantially fully and homogeneously illuminated.

This may be achieved in that the first grating 203 includes a plurality of reflecting lines each formed by a plurality of reflecting dots.

The reflecting dots generate a diffraction pattern within a diffraction pattern. Thus, each reflecting dot becomes a wavefront source, as viewed from the focal plane. Therefore, irregularities in intensity, particularly due to fly's eye facets of the source, will disappear, presenting a clean, regular image of the source at the focal plane. According to United States Patent Application Publication No. 2002/0145717, the reflecting dots have a random height with a standard deviation of many times a wavelength.

One possible disadvantage of this known grating that it may be difficult to manufacture, as it is difficult to obtain a pattern of reflective dots having a large difference in height while having a predetermined in-plane size.

SUMMARY

According to an aspect of the invention, there is provided a grating for EUV-radiation. The grating includes a plurality of reflecting lines. Each reflecting line includes a plurality of first reflecting dots, and a plurality of second reflecting dots arranged between each other. The first reflecting dots and the second reflecting dots are configured to reflect EUV-radiation with a mutual phase difference of 180±10 degrees mod 360 degrees.

According to an aspect of the invention, there is provided a wavefront measurement system that includes an imaging system configured to direct electromagnetic radiation from a source at an object plane so as to illuminate the object plane, and a first grating positioned in the object plane. The first grating includes a plurality of reflecting lines, each reflecting line includes a plurality of first reflecting dots, and a plurality of second reflecting dots arranged between each other. The first reflecting dots and the second reflecting dots are configured to reflect EUV-radiation with a mutual phase difference of 180±10 degrees mod 360 degrees. The measurement system also includes a projection optical system configured to project an image of the first grating onto a focal plane, a second grating at the focal plane, and a detector configured to receive a fringe pattern produced by the second grating. The grating may be positioned in the object plane. Contrary known gratings, the grating according to embodiments of the present invention can be manufactured relatively easily.

According to an aspect of the invention, there is provided a method for manufacturing a grating for EUV-radiation. The method includes providing a patterned substrate having first locations and second locations spread between each other. The first locations and the second locations have a mutual height difference. The method also includes depositing a multilayer forming a Bragg-reflector for the EUV-radiation at the patterned substrate, and applying a pattern of lines made of an EUV adsorbing material at the multilayer.

According to an aspect of the invention, there is provided a method for manufacturing a grating for EUV-radiation. The method includes providing a substrate, providing a first multilayer reflector on said substrate, providing a first combined capping/etch stop layer on said first multilayer reflector, and providing a second multilayer reflector on said first combined capping/etch stop layer. The method also includes providing a second combined capping/etch stop layer on said second multilayer reflector, applying a layer of an EUV-absorbing material, selectively etching the second multilayer reflector to obtain a pattern of first dots reflecting with a phase shift of 0 deg and second dots reflecting with a mutual phase difference of 180 deg±10 deg modulo 360 deg, and selectively etching the layer of absorbing material to obtain a pattern of reflecting lines.

Manufacturing of the grating according to embodiments of the invention may be substantially simplified in that it suffices that there are only two different height levels used for the substrate on which the Bragg reflector is deposited. The two different height levels and the Bragg reflector can be applied in a way known as such, e.g. as described in U.S. Pat. No. 6,392,792. Subsequently, a pattern of lines made of an EUV adsorbing material can be made at the multilayer.

Nevertheless other methods are applicable to manufacture a grating according to the present invention. According to one such method in a first step a Bragg-reflector is deposited at a substantially flat substrate. In a next step the surface of the Bragg-reflector is patterned to form the first and second reflecting dots. After this step a pattern of lines of EUV adsorbing material (such as Cr or TaN-based material) is applied at the patterned surface. Other steps may intervene, e.g. the patterned Bragg-reflector may be provided with a capping layer, e.g. made of Ru before the pattern of absorbing lines is applied.

The lines have a width typically an order of magnitude larger than that of the reflecting dots formed within the lines. In preferred embodiments the lines have a width in the range of 1 μm to 10 μm, while the reflecting dots are between 70 nm and 120 nm in diameter. Hence a ratio between the width of the lines and a width of the dots may be in a range of 5 to 150.

Surprisingly, for systems using incoherent radiation a pattern of reflecting dots introducing only phase differences of 180 degrees (mod 360 degrees) provides for an efficient reduction of the $0^{th}$ order contribution in the diffraction pattern. Nevertheless further dots may be present that may provide for phase differences of 90 degrees and/or 270 degrees mod 360 degrees.

In an embodiment of the grating, the first and second reflecting dots completely fill the area within the reflecting lines. This may have an advantage of a relatively high efficiency. The optical properties of the grating can be amended by tuning the exact phase difference between the first and the second dots.

In an embodiment of the grating, the first and second reflecting dots within the reflecting lines are separated by absorbing portions. This may have an advantage that more parameters are available to determine the optical properties of the diffraction pattern. The size of the first and the second dots may be tuned independently from each other. The first and the second reflecting dots may be spread regularly between each other, according to a predetermined pattern, e.g. a chessboard pattern, but may alternatively be spread irregularly, in a random manner.

BRIEF DESCRIPTION OF THE DRAWINGS

These and other aspects are described in more detail with reference to the drawings in which:

FIGS. 7A and 7B schematically show a grating according to an embodiment of the present invention;

FIG. 14A to 14C illustrates aspects relating to cleaning of a grating, therein FIG. 14A illustrates a carbon deposition in a first type of grating;

FIG. 14B illustrates a process of cleaning this grating;

FIG. 14C illustrates a process of cleaning a different type of grating;

FIG. 15A illustrates a grating with rectangular openings;

FIG. 15B illustrates a detail of FIG. 15A,

FIG. 15C illustrates a different grating.

DETAILED DESCRIPTION

Figure 1B:
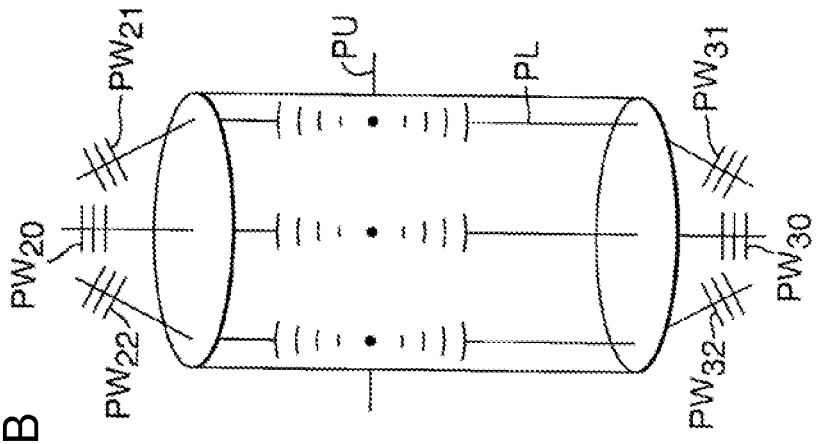
FIGS. 1A, 1B and 1C schematically shows a measurement method for measuring wavefront aberrations in an optical system.
Figure 1A:
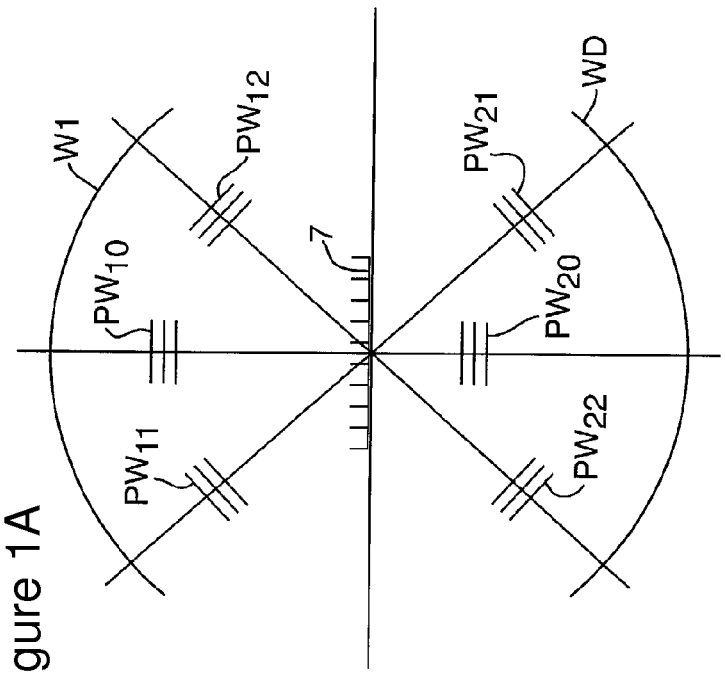
Figure 1C:
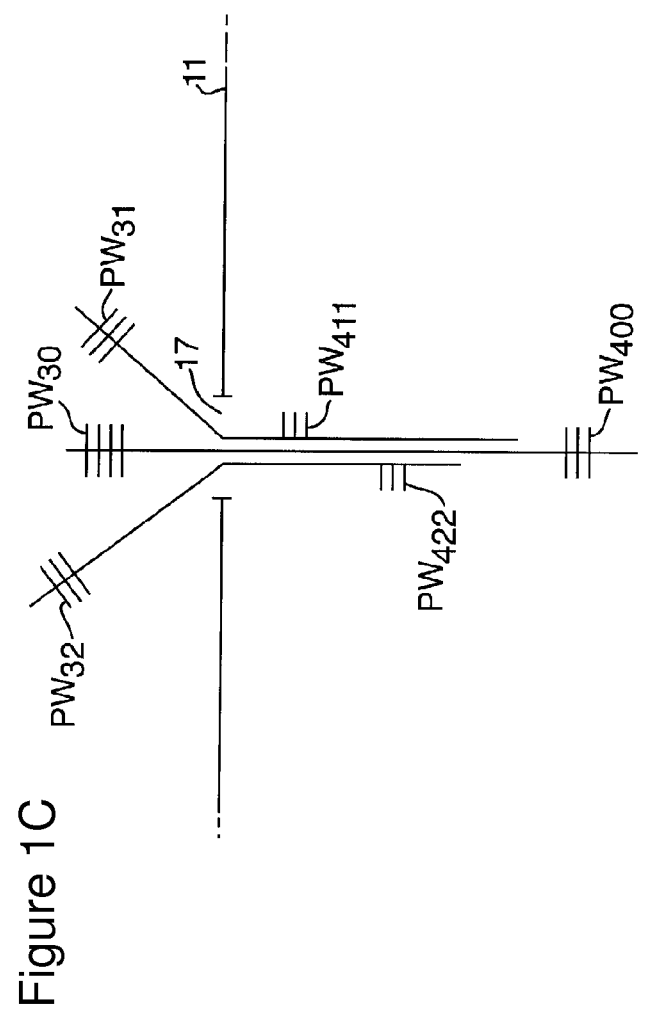

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention. The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Thus, the regions illustrated in the Figures are schematic in nature and their shapes are not intended to illustrate the actual shape of a region of a device and are not intended to limit the scope of the invention.

It will be understood that when a layer is referred to as being "on" a layer, it can be directly on the other layer or intervening layers may be present. In contrast, when an element is referred to as being "directly on," another layer, there are no intervening layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
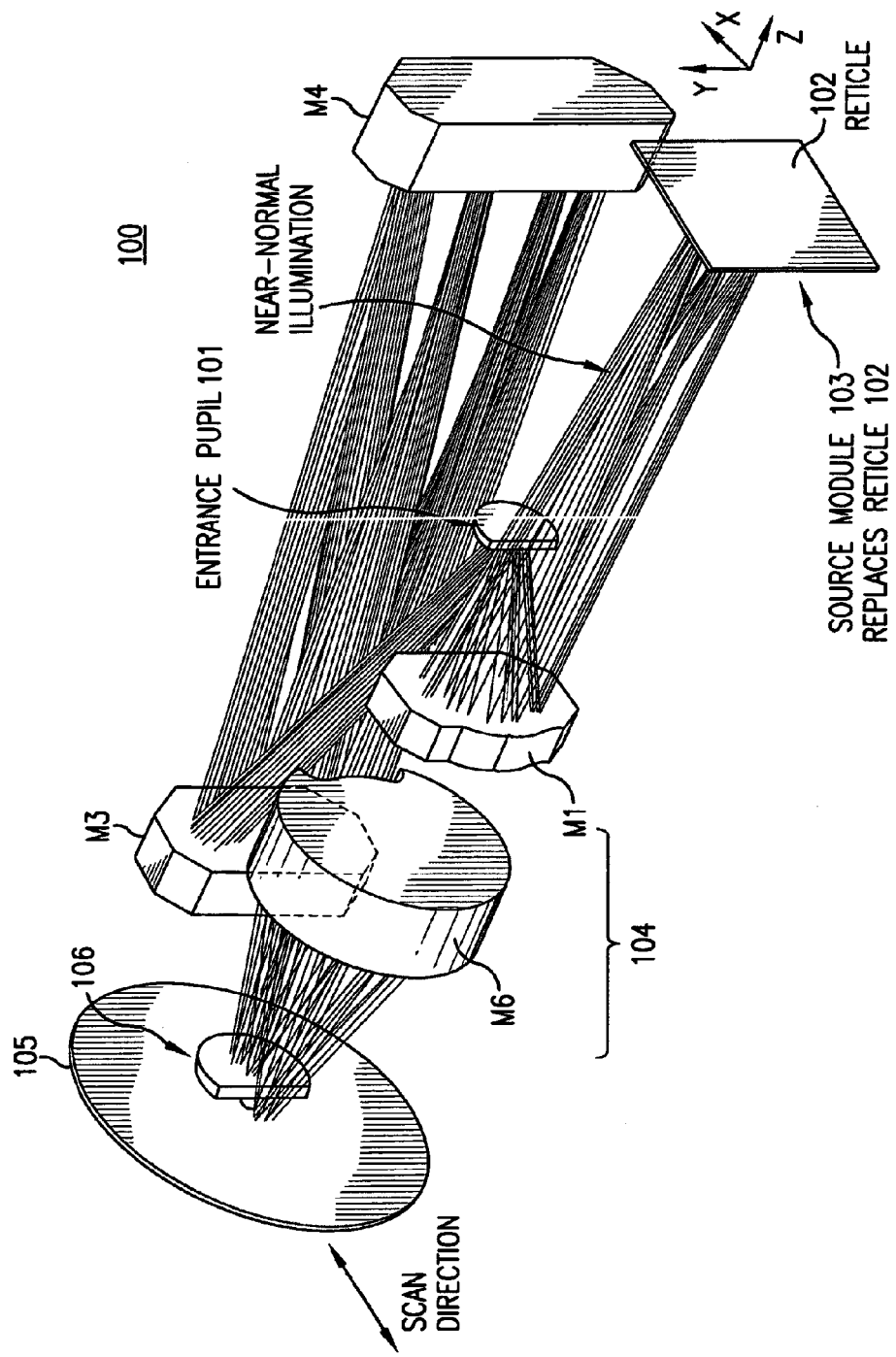
FIG. 2 schematically shows an EUV-lithographic system.

FIG. 2 illustrates a portion of an EUV photolithographic system 100, which includes an EUV source (not shown in FIG. 2). The system 100 also includes image optics (including mirrors M4 and M3), a pupil 101, a patterning device 102, such as a reticle, mounted on a support, such as a reticle stage (not shown) with an image of a pattern to be imaged onto a substrate 105, such as a wafer, and projection optics 104, which includes mirrors M1 and M6. The EUV radiation is then projected onto the substrate 105, which is mounted on a substrate support, such as wafer stage (not shown). It will be appreciated that the patterning device 102 is reflective in EUV systems, unlike photolithographic systems operating at longer wavelengths, such as deep ultraviolet, or visible, where the patterning device 102 is usually transmissive.

As further shown in FIG. 2, in the present invention, a sensor module 106 is placed on the wafer stage, and a source module 103 is placed on the reticle stage, to measure the wavefront. The sensor and source modules 106, 103 may also be referred to as a wavefront sensor (WFS).

Figure 3:
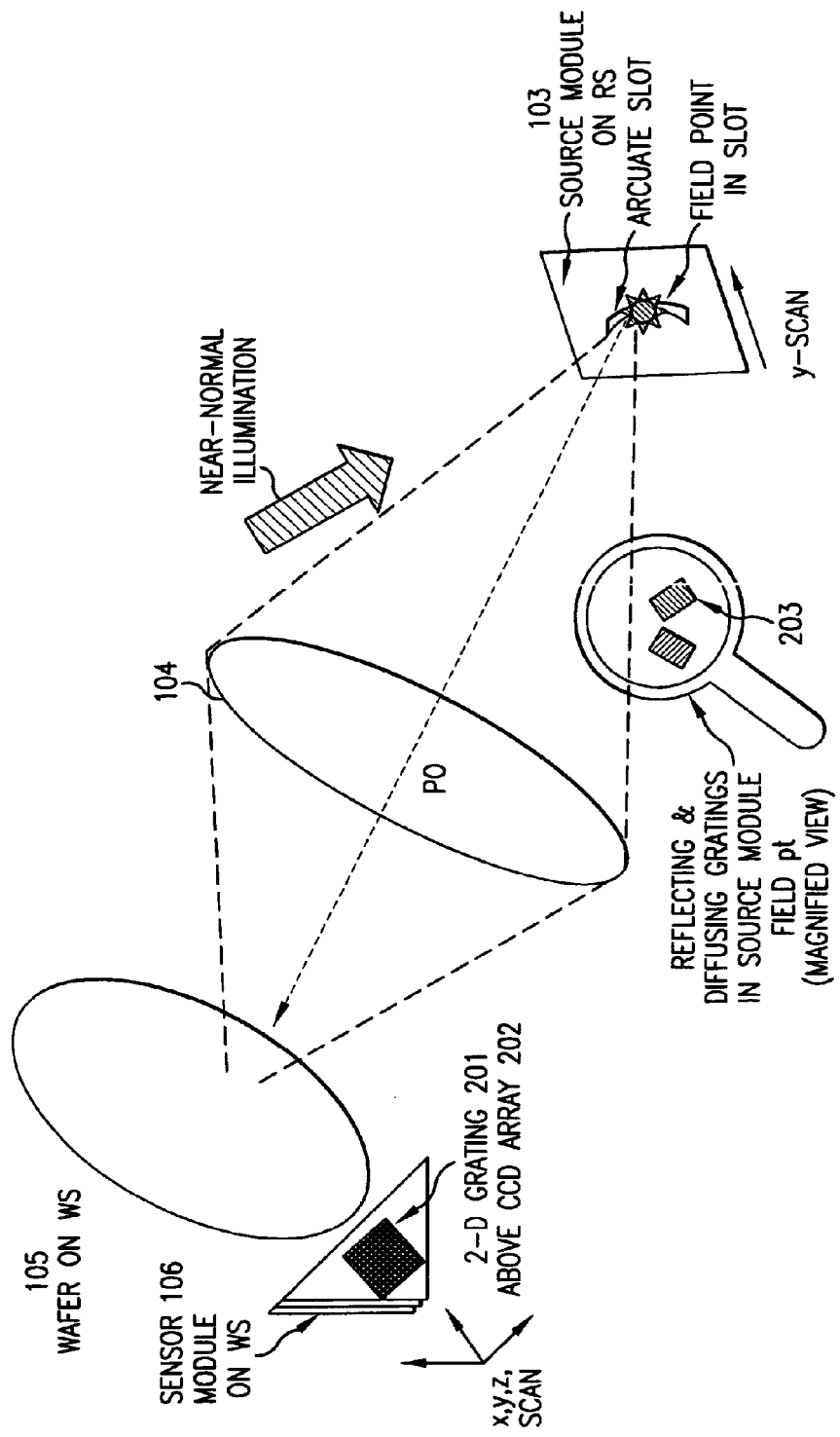
FIG. 3 schematically shows a measurement method for measuring wavefront aberrations in an EUV-lithographic system.

FIG. 3 is an illustration of the wavefront measurement arrangement in which at least one embodiment of the present invention may be applied, particularly as it can be incorporated into a photolithographic system. In FIG. 3, parts corresponding to those in FIG. 2 have the same reference number. As may be seen in FIG. 3, the source module 103 may be placed on the reticle stage, and in an embodiment includes two orthogonally oriented gratings. The wavefront sensor (or sensor module 106) is placed on the wafer stage and includes a 2-D grating 201 and a CCD detector 202 that is positioned below the 2-D grating. The projection optics (PO) 104 remain the same as during normal exposure operation, e.g. as shown in FIG. 2.

The wavefront can be measured when imaging is not being performed. In order to measure the wavefront, the reticle stage is moved, such that one of the gratings 203 in the source module 103 on the reticle stage is placed in the optical path, rather than the reticle 102 itself. The wafer stage is also moved such that the wavefront sensor is positioned to receive an image of the source module grating 203. The CCD detector 202 below the 2-D grating 201 then receives and measures the transmitted radiation. The reticle stage can then be moved to place a different diffraction grating in the optical path, so as to measure the wavefront with an orthogonal orientation of the source module grating 203.

Figure 4:
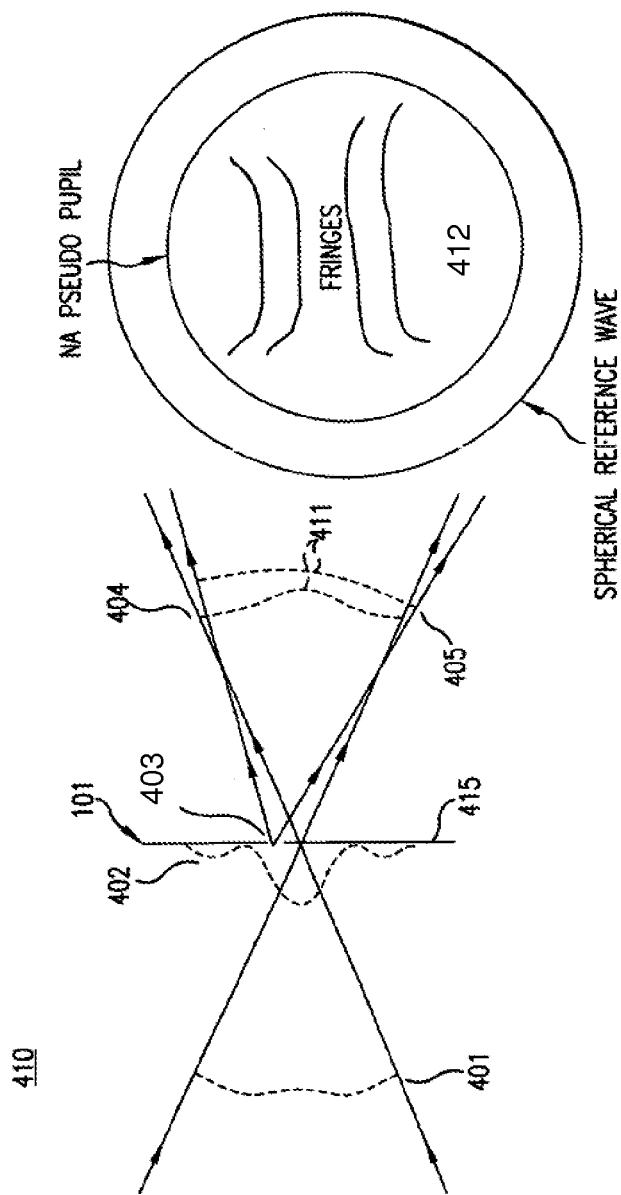
FIGS. 4 and 5 demonstrate the occurrence of a fringe pattern in a shearing interferometer unit.
Figure 5:
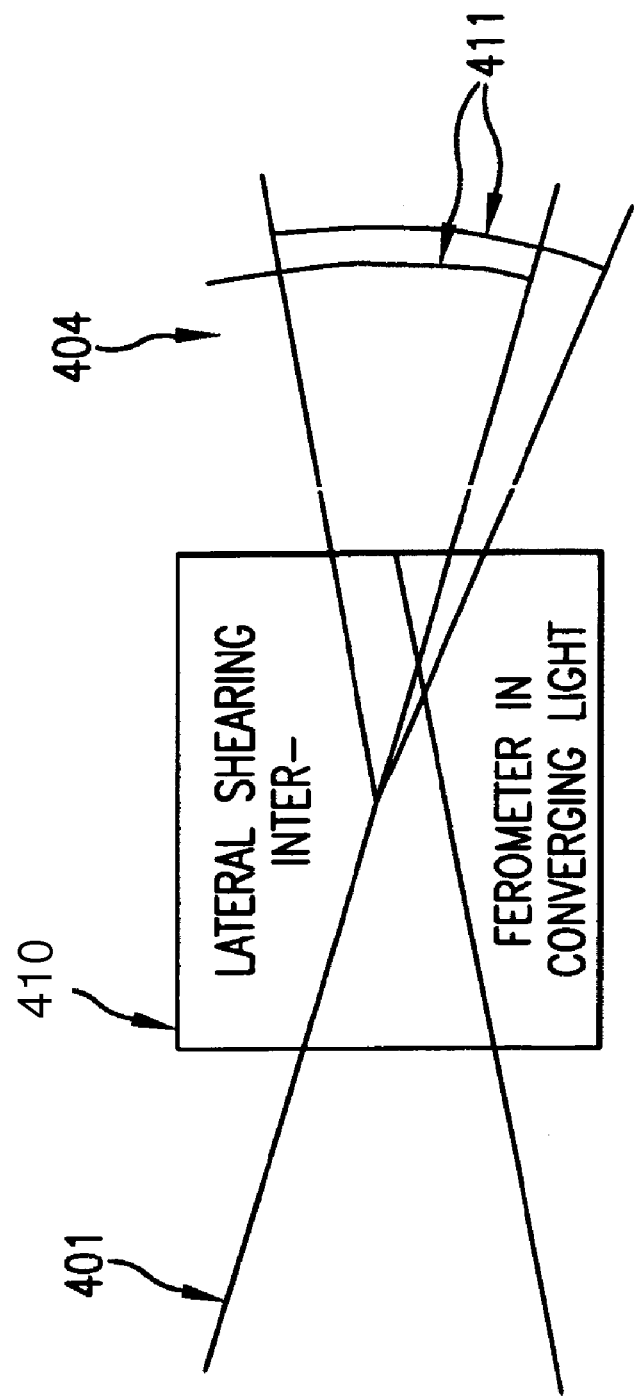

FIGS. 4 and 5 illustrate the use of a pupil in a lateral shearing interferometer 410 to produce reference wavefronts and shear wavefronts. (See also the entrance pupil 101 in FIG. 2). As shown in FIGS. 4 and 5, a wavefront 401 converges at a point in space, while emanating from a primary source. An image of a point source 402 exists at an entrance pupil 101. A partially transmitting film 415 may be placed at the entrance pupil 101. A pinhole 403 is positioned at the entrance pupil 101. The pinhole 403 generates a transmitted wave 404 with a wavefront 411, which includes a diffracted spherical reference wave 405. Thus, the lateral shearing interferometer 410 creates one or more apparent sources, whose wavefronts 411 interfere to produce fringes 412.

Figure 6:
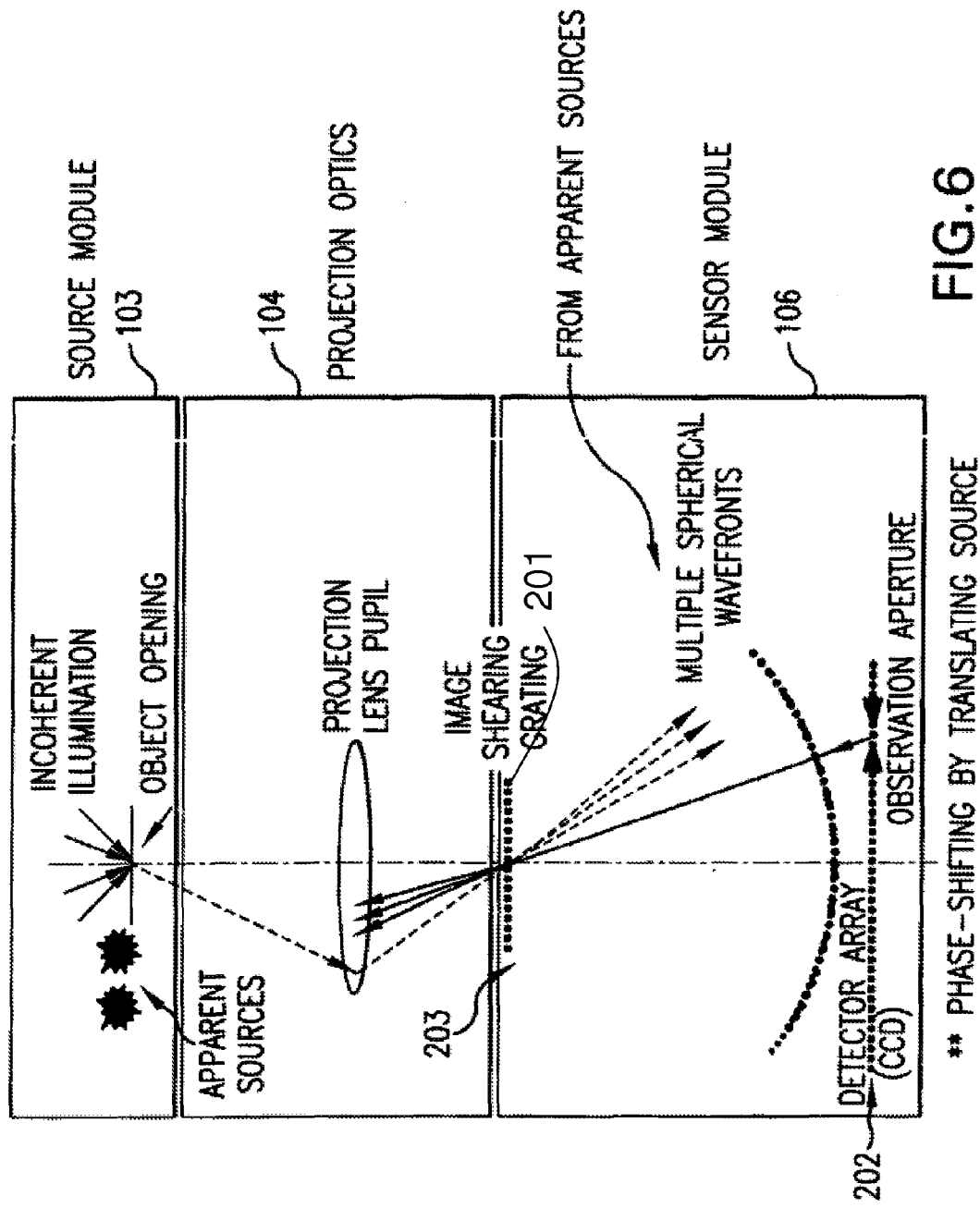
FIG. 6 schematically shows an arrangement used for measuring wavefront aberrations in an EUV-lithographic system.

FIG. 6 is another illustration of the wavefront measurement system in which embodiments of the present invention is applicable, showing the source module 103 positioned in the object plane (i.e. patterning device plane, not labeled in the Figures), the projection optics 104, and the sensor module 106. An image shearing grating 201 is positioned on the wafer stage, and generates multiple wavefronts that are then detected as fringe patterns in the sensor module 106.

FIGS. 7A and 7B illustrate an embodiment of a grating 702. As shown in FIG. 7A, two orthogonally oriented gratings collectively form a source module grating 203, such as the source module grating discussed above. The two orthogonal gratings each have a size of 200×200 μm. As is shown in more detail in FIG. 7B, reflecting lines 704 may have a width of about 3.2 μm and comprise a plurality of reflecting dots 706. The dots 706 comprise first reflecting dots and second reflecting dots. The first reflecting dots and he second reflecting dots reflect EUV-radiation with a mutual phase difference of 180+/−10 degrees mod 360 degrees.

The reflecting dots can be randomly scattered, as shown in FIGS. 7A and 7B, or can be arranged in a regular matrix pattern.

As may be seen from FIG. 7A, the lines 704 of the grating 702 of the source module, when seen "from far away," appear to be solid lines, as discussed above. However, when viewed "up close" (as illustrated in FIG. 7B), they are instead made up of a number of reflecting dots. The remainder of the material, for EUV application, may be absorbing material.

The grating lines are chosen to have a direct relation to the $2^{nd}$ order grating lines so as to further maximize the use of the object plane illumination, preserve fringe visibility at the detector, and eliminate + and −1 order fringes.

In an embodiment, the diameter of the dots, for the parameters discussed above (6.4 μm for 4× magnification, 0.25 output numerical aperture, 0.0625 input numerical aperture, 13.5 nm source) is between about 70 and about 120 nm, and may be about 70 nm.

It will be appreciated that with the use of the first and second reflecting dots of embodiments of the present invention, the single diffraction pattern becomes a diffraction pattern within a diffraction pattern. Thus, each reflecting dot becomes a wave front source, as viewed from the focal plane. Therefore, irregularities in intensity, particularly due to fly's eye facets of the source, should disappear, thereby presenting a clean, regular image of the source at the focal plane. The reflecting dot pattern of the grating 203 may also have the advantage that it overfills the 0.0625 numerical aperture of the projection optics, and utilizes as much light that is incident onto the grating 203 as possible. Furthermore, no additional pupil facets or pupil structures are introduced if illumination at the object plane is spatially incoherent. The reflecting dot grating shown in FIGS. 7A and 7B can be fabricated on a standard reticle blank. The dot diameter is preferably chosen to more than overfill the numerical aperture, so as to provide near-uniform pupil illumination.

A factor of 2 drop-off in intensity may be allowable for each dot, since photon noise-limited elemental detection signal-to-noise ratio increases only by the square root of two. Larger diameters may be desirable due to manufacturability issues. Calculations show that a 44 nm diameter dot gives a 10% drop-off, a 66 nm diameter dot gives a 20% drop-off, and a 112 nm diameter dot gives a 50% drop-off, for example.

Thus, the reflecting dot grating 203 of an embodiment of the present invention is an example of a reflective EUV scattering device that in this case has 0.4% efficiency for the large number of dots and first grating size, with an additional goal of maximizing the efficiency. Efficiency here is defined as the fraction of the illumination power falling within the desired numerical aperture after reflection from the device, as compared to a Lambertian diffuser.

A tailored reflecting EUV diffractor may fill the input numerical aperture of the projection optics to eliminate pupil facets due to the illumination subsystem, and to maximize utilization of the illumination for optical system aberration measurements at EUV wavelengths using a lateral grating shearing interferometer. The last may utilize the equivalent of a grating placed in front of the incoherent extended source in the reticle plane. The first two may require that the input illumination be reflected by a diffractor with a more favorable pattern than a Lambertian diffuser. The tailored reflecting diffractor may be an ensemble of micro-reflector diffraction-limited dots in the form of a grating. The individual reflecting dots in that ensemble would be placed at the "slits" of the 50% duty cycle "grating" and each individual reflecting dot of the size and shape to fill by diffraction the input numerical aperture of the optics being measured. For a numerical aperture of 0.0625 at 13.5 nm, the dot diameter may be 70 nm (to 210 nm). A single 70 nm dot would yield about 0.01 "detectable" EUV photon in EUV ILIAS measurement systems. However, a 50% duty cycle "grating" 300 μm long, with 45 lines of pitch 6.4 μm, and with dots only along the central axis of each line, could accommodate enough spots to yield up to 1,000 "detectable" photons which are more than adequate for EUV ILIAS measurement systems. "Grating" lines filled with dots would give larger signals. A single (dotted) line would give an inadequate signal. A Lambertian diffuser and regular grating of similar form would give a barely adequate signal.

In an embodiment, the pattern of reflecting dots may comprise further dots that introduce a phase difference differing both from the first and the second dots, for example, the pattern may comprise first dots that introduce no phase shift, second dots that introduce a phase shift of 180 degrees, third dots that introduce a phase shift of 90 degrees and fourth dots that introduce a phase shift of 270 degrees.

In the embodiment of the grating shown in FIGS. 7A and 7B, the first and second reflecting dots within the reflecting lines are separated by absorbing portions. This may have the advantage that the diffraction pattern can be adjusted in various ways.

Figures 8A, 8B:
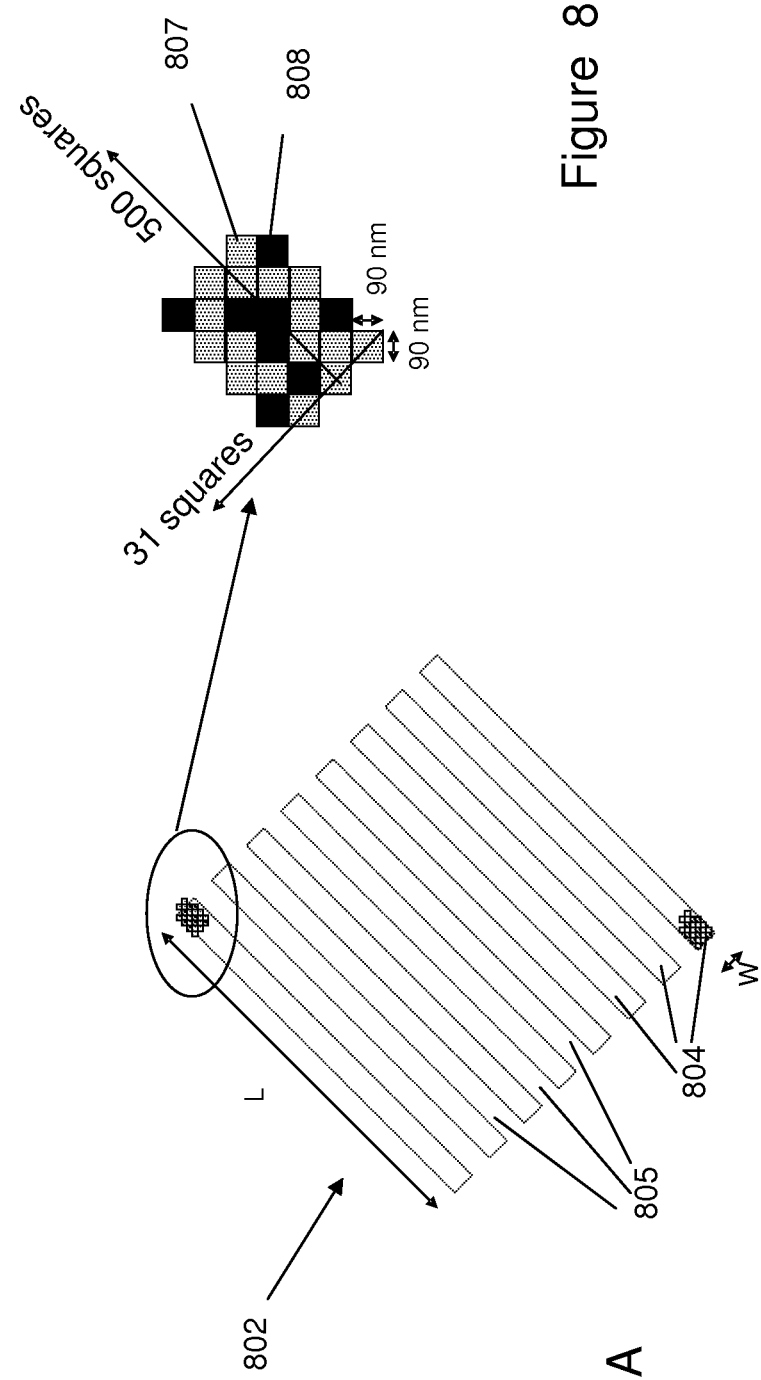
FIGS. 8A and 8B schematically show a grating according to an embodiment of the present invention.
Figures 9A, 9B, 9C, 9D:
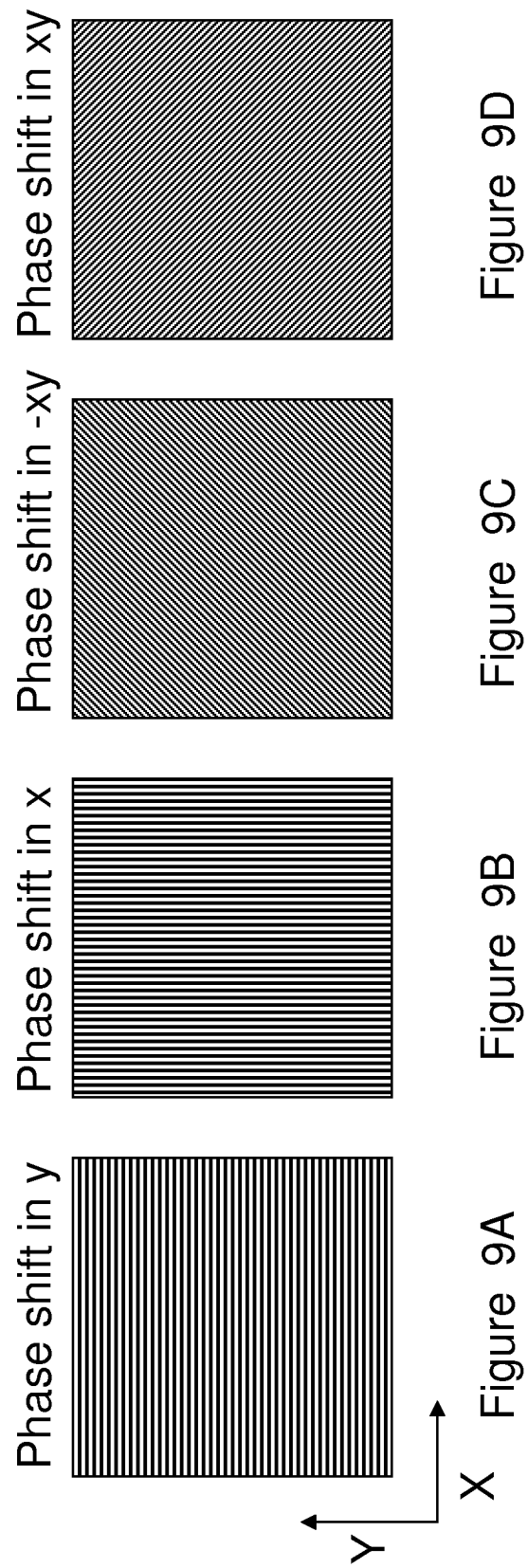
FIGS. 9A to 9D show gratings according to embodiments of the present invention.
Figure 10B:
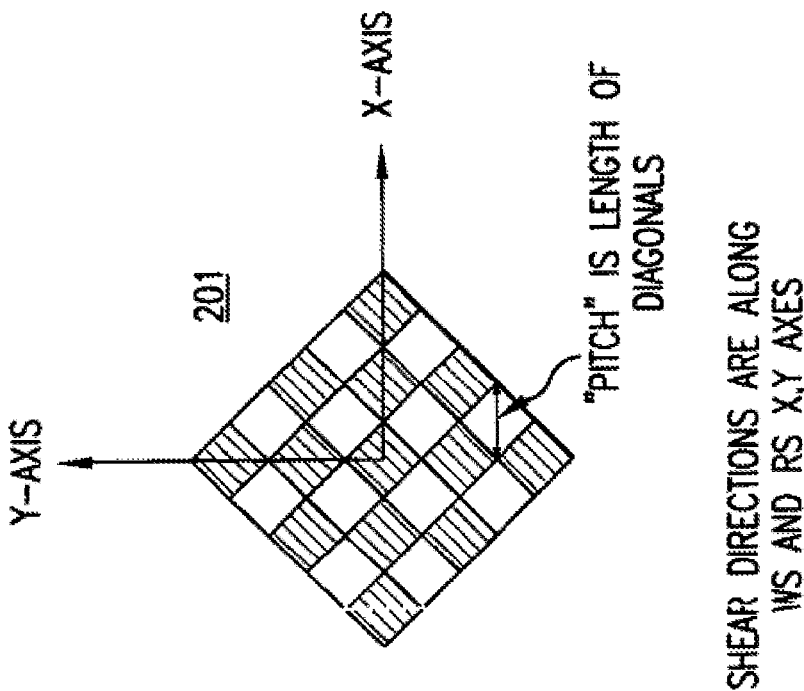
FIG. 10B shows an embodiment of a second grating for use in a wavefront aberration measurement system according to an embodiment of the invention.
Figure 10A:
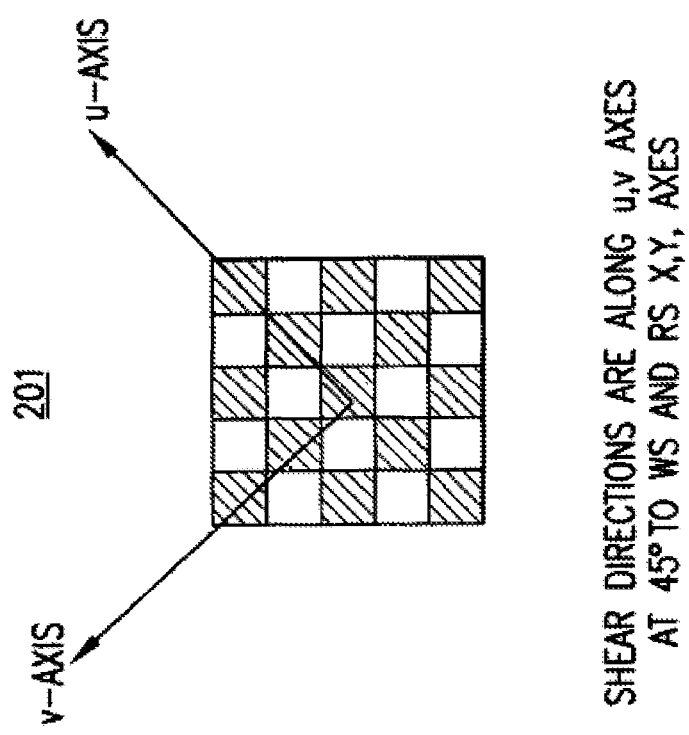
FIG. 10A shows an embodiment of a first grating for use in a wavefront aberration measurement system according to an embodiment of the invention.

FIG. 8A shows an embodiment of a pattern of lines 804 at the patterning device with a grating 802, and FIG. 8B shows the pattern of reflecting dots within the lines 804 in more detail. Therein the reflecting dots completely fill the area within the reflecting lines. This embodiment may have the advantage of a high reflection. The reflecting lines 804 are alternated by EUV absorbing lines 805. By way of example, the patterning device may comprise reflecting lines having a length L of 45.12 µm and a width W of 2.82 µm. In the illustrated embodiment, the reflecting dots are shaped as squares having size of 90 nm. The squares are arranged with a diagonal in the direction of the lines. The lines are images onto the sensor module; in an embodiment, this has a checkerboard grating (FIG. 10A). In that case, the sensor moves diagonally ('u' or 'v') so that the structure is integrated diagonally and hence the lines in FIG. 8A should also be diagonal ('u' or 'v'). In an embodiment, the sensor may contain diamonds (FIG. 10B) and then the orientation at the reticle would be 'x' and 'y' (FIG. 9A, and FIG. 7). In an embodiment, a pinhole array may replace the checkerboard on the sensor. As shown in FIG. 8B, the pattern of square shaped dots comprises first dots 807 indicated in gray that introducing no phase shift or a phase shift of n.360 degrees, and second dots 808 indicated in black that introduce a phase shift of approximately 180 degrees mod 360 degrees. By selecting the difference in phase shift between the first and second dots 807, 808 in a range of, for example, 180 degrees +/−10 degrees, the diffraction pattern induced by the pattern of dots can be adapted.

The present invention need not be limited to the use as a reticle for measuring wavefront aberrations. FIGS. 9A-9D shows various examples of reticles, each comprising a plurality of lines comprised of a plurality of first and second reflecting dots. The reticles shown in FIGS. 9A-9D each have a plurality of parallel lines that are used to introduce a phase shift in y, in x, in a direction −xy and a direction xy, respectively. FIGS. 10A and 10B illustrates embodiments of the 2-D grating 201 for use in a wavefront measurement system of the present invention. As shown in FIGS. 10A and 10B, a checkerboard grating can be used, with a carefully chosen pitch of the grating. Such a grating can be manufactured on a substrate of, e.g., 100 nanometers thick, made of a material that is transmissive at the exposure wavelength. For example, for an exposure wavelength of 13.5 nanometers, examples of such transmissive materials include silicon and silicon nitride. The 2-D checkerboard diffraction grating 201 thus can be said to have a 50% duty cycle. The primary interference will be of $0^{th}$ order with the + and $-1^{st}$ order. The pseudo-randomized nature of diffuse scattering from source module 103 is expected to effectively wash out spatial variation in the wavefront across the projection optics 104 pupil. As may be seen in FIGS. 10A and 10B, the pitch of the 2-D grating 201 is the length of the perpendicular square.

The 2-D grating 201 may also include reflective (or opaque) regions, as may be seen in FIGS. 10A and 10B. Opaque regions can be formed of materials that absorb EUV radiation (this case, for 13.5 nm exposure wavelength), such as nickel, chromium or other metals.

In an embodiment, the checkerboard grating pitch may be 1.6 microns. The pitch should be carefully chosen to cause an appropriate angle for first order diffraction (as discussed below) for a particular shear ratio and numerical aperture. In an embodiment, the shear ratio may be $\frac{1}{30}^{th}$, although it will be appreciated by one of ordinary skill in the art that embodiments of the invention are not limited to these particular numbers or dimensions. In an embodiment, the output numerical aperture of the system may be 0.25 (and the input numerical aperture may be 0.0625, for 4× magnification), although embodiments are not limited to this particular numerical aperture.

Figure 10C:
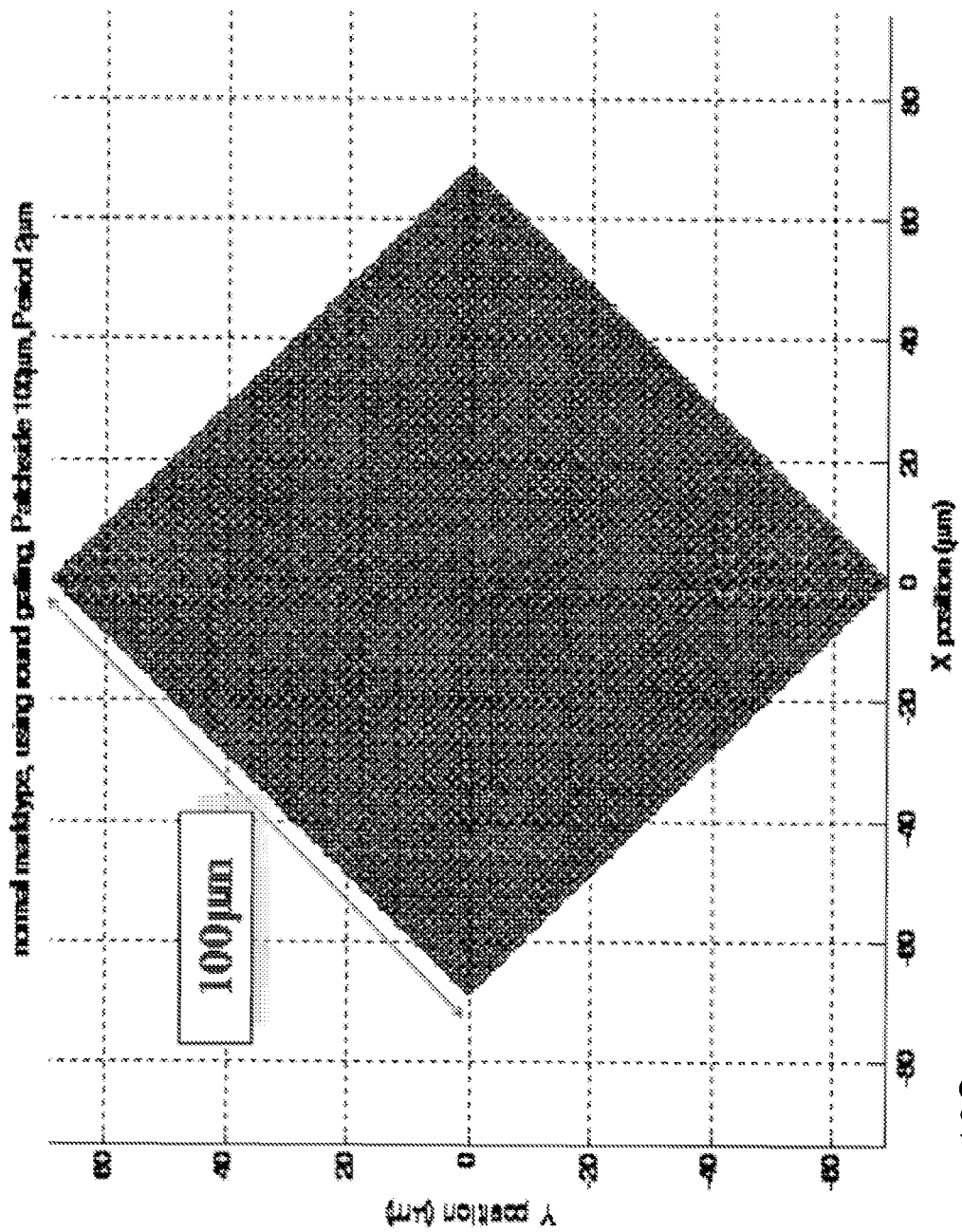
FIG. 10C shows an embodiment of a third grating for use in a wavefront aberration measurement system according to an embodiment of the invention.

As noted above, the pitch of the 2-D grating 201 may be chosen in an embodiment to provide a shear ratio of $\frac{1}{30}^{th}$, where the CCD detector 202 is in the fringe plane (i.e., below the focal plane of the system), and "sees" a pattern of fringes (an interferogram) or a number of overlapping circles. The shear ratio is a measure of the overlap of two circles, where a shear ratio of zero represents perfect overlap. It is desirable for the CCD detector 202 to "see" only the $0^{th}$ order and the + and $-1^{st}$ order diffraction images, and to eliminate the + and $-2^{nd}$ order on diffraction images. For this purpose, the second grating may have a 50% duty-cycle. This may be achieved with a checkerboard grating with square transmission and reflection areas, as shown in FIGS. 10A and 10B. In an embodiment, a pin-hole array may be applied as shown in FIG. 10C, and in more detail in FIG. 10D, and may be manufactured as an array of holes etched in a silicium layer of a few µm, e.g. 2 µm. In this way, an array may be obtained of fully transmissive holes (100% transmission) and a substantially non-transmissive background (<1% transmission). The pinhole array shown in FIG. 10C has a size of 100 µm. As shown in more detail in FIG. 10D, the array is provided with pinholes having a diameter of 1.13 µm and arranged at a regular grid having a period of 1.41 µm that is oriented at an angle of 45 deg with respect to the x-axis.

The first grating 103 may be constructed to aid in eliminating unwanted orders. For whichever pattern of transmission and reflection areas is used, there should be a regular pattern that forms a 2-D grating. Other shapes, in addition to square shapes, are possible, e.g., circular reflective areas, or circular transmissive areas, etc., as long as the pattern is regular.

Some of the tolerancing issues between the sensor module 106 and the source module 103 may be resolved by first fabricating the 2-D grating 201 of the sensor module 106, measuring its exact dimensions, and then fabricating the source module gratings 203 accordingly. In a 4× magnification system, the pitch of the linear grating of the source module 103 may be exactly 4× the pitch of the 2-D grating 201 of the sensor module 106. Thus, for a 1.6 micron pitch of the 2-D grating 201, the pitch of the source module grating 203 may be 6.4 microns. However, if the 2-D grating 201 is measured to be deviating by, for example, 10% from the nominal value of 1.6, the source module grating 203 can be manufactured accordingly to have a pitch 4× times the measured checkerboard grating pitch. This may reduce the need for extreme precision in the manufacture of both sets of gratings simultaneously.

In an embodiment, the 2-D grating 201 may be a cross grating, such that two linear gratings of an appropriate pitch are essentially placed one on top of another, with each grating having the appropriate pitch dimension to result in an appropriate combined diagonal pitch. It is believed, however, that the checkerboard grating may give better results.

In an embodiment, a checkerboard grating or a cross grating can be used in the source module 103 instead of two separate linear gratings, although the use of a 2-D grating in the source module 103 may complicate the detector readout and the analysis mathematics used to interpret the fringe pattern.

Although the discussion above is primarily in terms of a EUV photolithography system, where reflective optical elements are typically used (such as the source module gratings 203, the projection optics 104, and the imaging optics), embodiments of the invention are equally applicable to other wavelengths used in the photolithographic system, with appropriate transmissive/refractive components used in place of reflective ones, as appropriate.

FIGS. 10E-10P show some further non-limitative examples of gratings for use in a lithographic apparatus according to the invention taking into account the above observations.

Figure 10D:
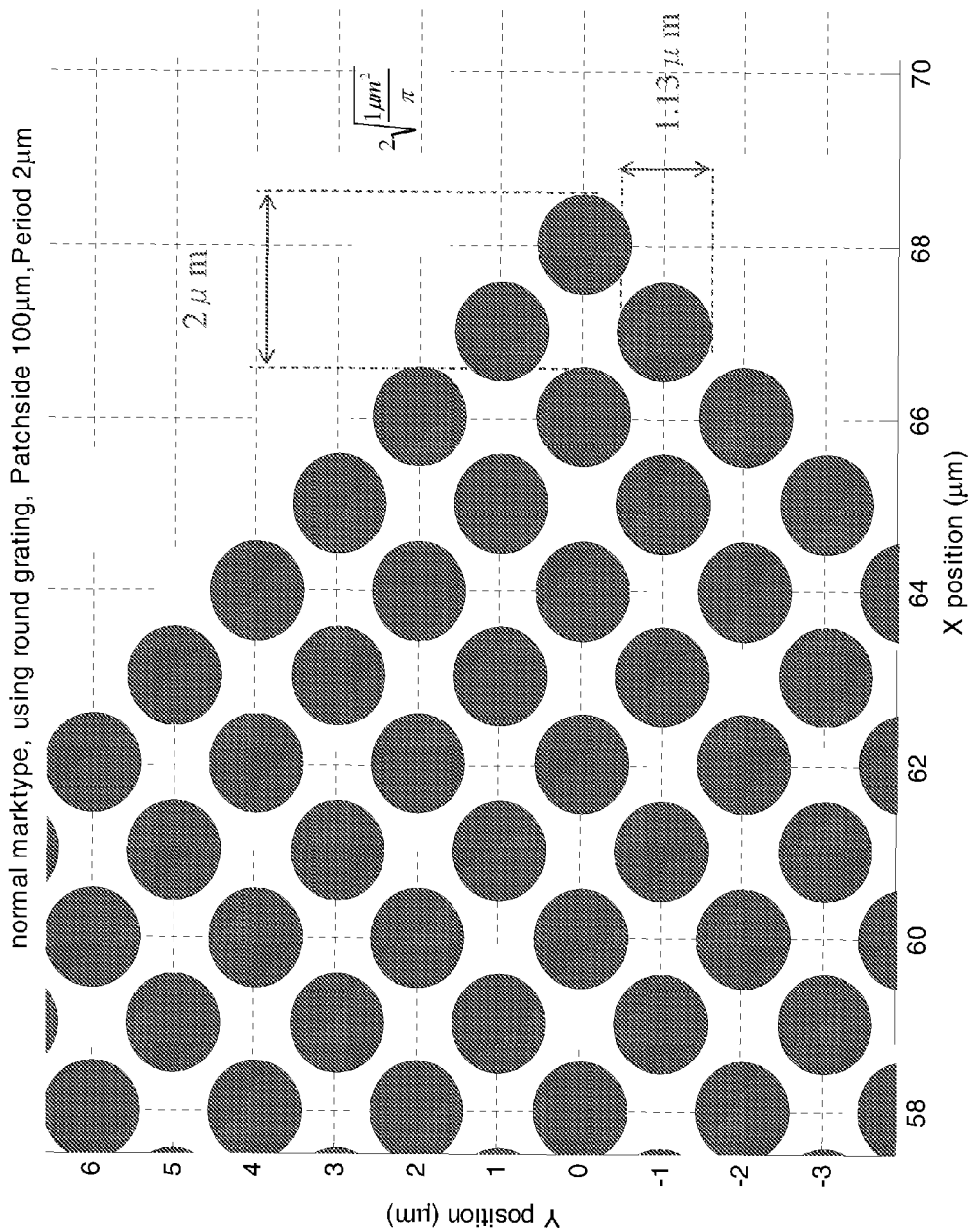
FIG. 10D shows a detail of the embodiment of FIG. 10C.
Figures 10E, 10F, 10G:
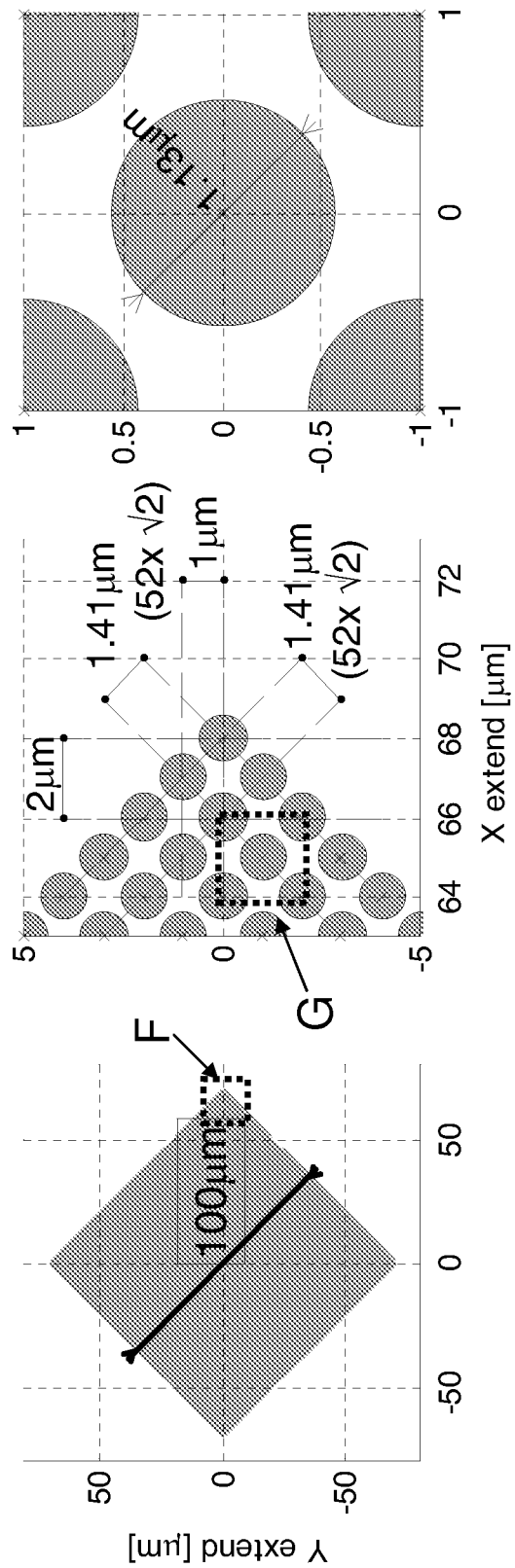
FIG. 10E shows an embodiment of a fourth grating for use in a wavefront aberration measurement system according to an embodiment of the invention.
FIG. 10F shows an enlarged portion of said fourth embodiment according to F in FIG. 10E.
FIG. 10G shows a further enlarged portion of said fourth embodiment according to G in FIG. 10F.

FIG. 10E shows a first square grating having sides of 100 μm. An enlarged portion thereof according to the dotted square indicated by F is shown in FIG. 10F. The grating comprises a plurality of circular pinholes that are arranged in a rectangular grid having a pitch in both directions of 1.41 μm. The pinholes have a diameter 1.13 μm as illustrated in FIG. 10G which is an enlarged view according to the dotted rectangle G in FIG. 10F. In this embodiment the square grating and the rectangular grid are rotated by 45° with respect to the axes X and Y.

Figures 10H, 10I, 10J:
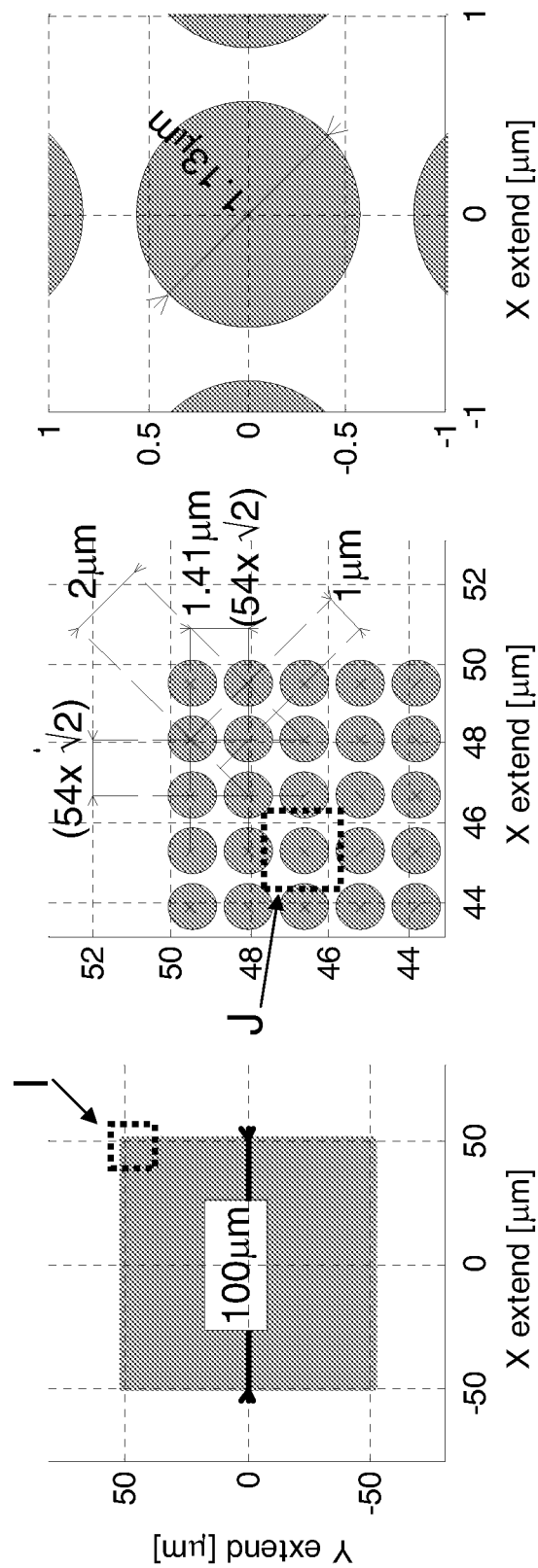
FIG. 10H shows an embodiment of a fifth grating for use in a wavefront aberration measurement system according to an embodiment of the invention.
FIG. 10I shows an enlarged portion of said fifth embodiment according to I in FIG. 10H.
FIG. 10J shows a further enlarged portion of said fifth embodiment according to J in FIG. 10I.

FIG. 10H shows a second square grating having sides of 100 μm. An enlarged portion thereof according to the dotted square indicated by I is shown in FIG. 10I and an enlarged portion according to the dotted square indicated by J is shown in FIG. 10J. This second square grating and the first square grating according to FIGS. 10E-10F have the same specifications, except that the second square grating is aligned with respect to the axes X and Y.

Figures 10K, 10L, 10M:
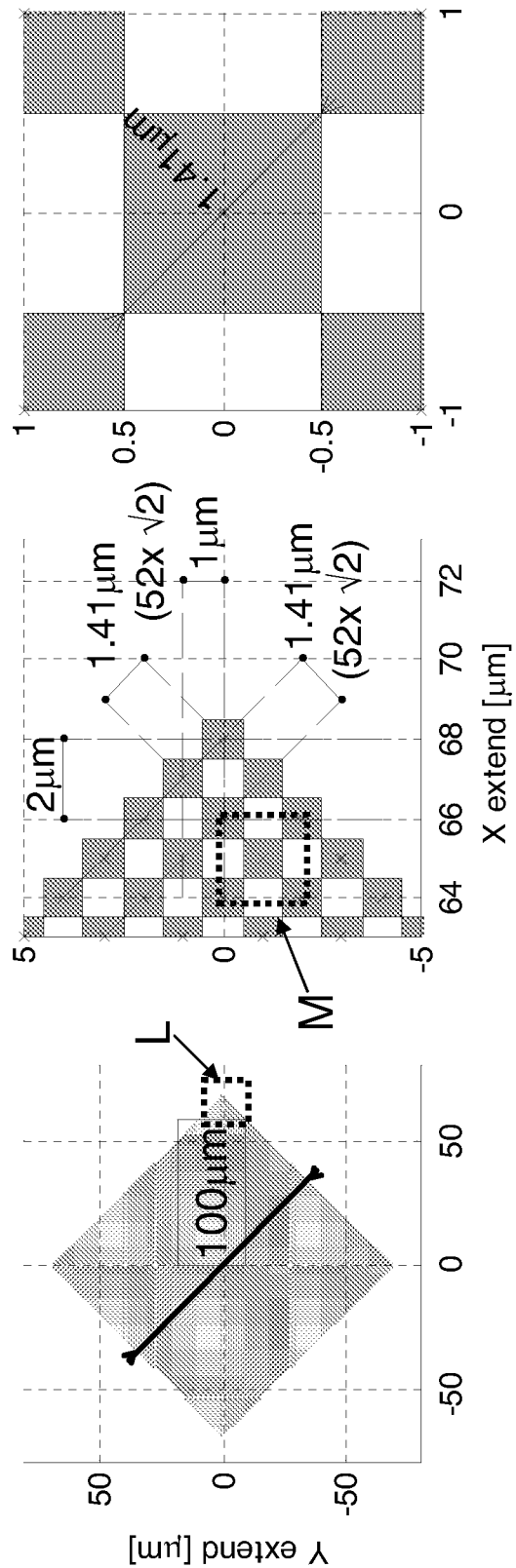
FIG. 10K shows an embodiment of a sixth grating for use in a wavefront aberration measurement system according to an embodiment of the invention.
FIG. 10L shows an enlarged portion of said sixth embodiment according to L in FIG. 10K.
FIG. 10M shows a further enlarged portion of said sixth embodiment according to M in FIG. 10L.

FIG. 10K shows a third square grating having sides of 100 μm. An enlarged portion thereof according to the dotted square indicated by L is shown in FIG. 10L. The grating comprises a plurality of rectangular pinholes that are arranged in a rectangular grid having a pitch in both directions of 1.41 μm. The pinholes have a diameter 1.41 μm as illustrated in FIG. 10M which is an enlarged view according to the dotted rectangle M in FIG. 10L. In this embodiment the square grating and the rectangular grid are rotated by 45° with respect to the axes X and Y. Also the rectangular pinholes are rotated by 45° with respect to the axes X and Y.

Figures 10N, 10O, 10P:
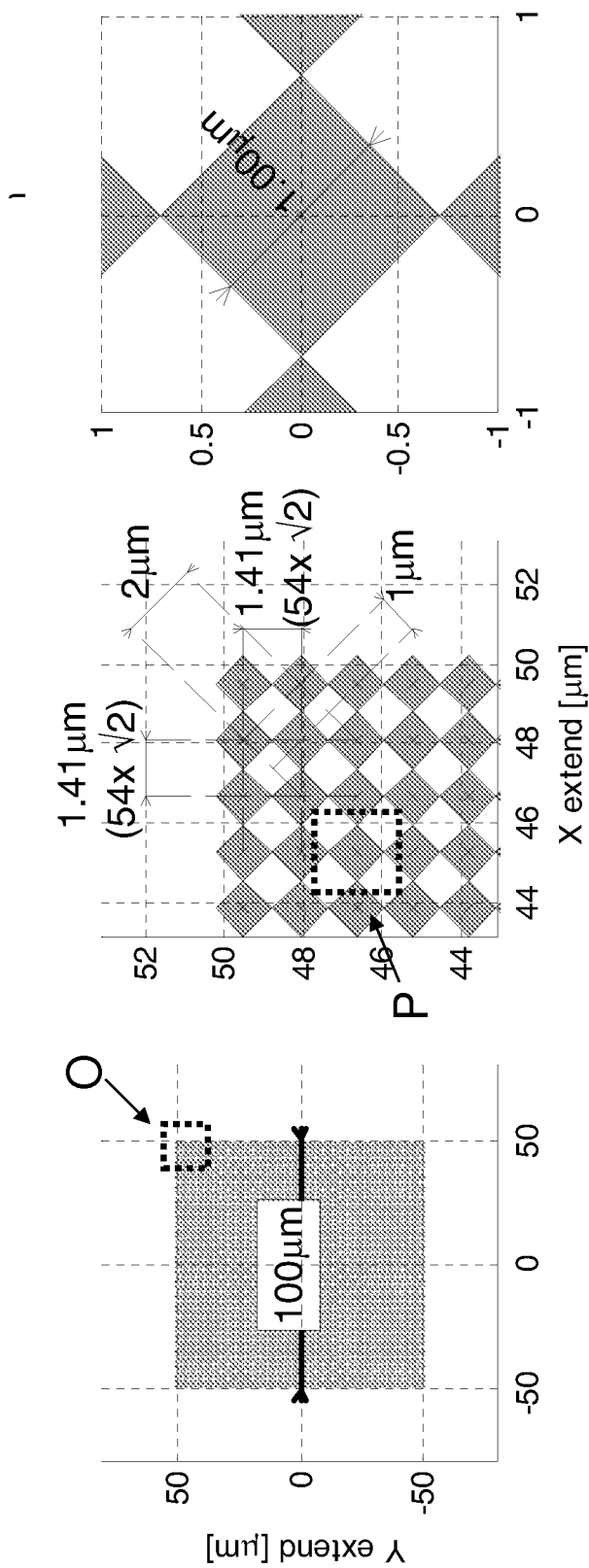
FIG. 10N shows an embodiment of a seventh grating for use in a wavefront aberration measurement system according to an embodiment of the invention.
FIG. 10O shows an enlarged portion of said seventh embodiment according to O in FIG. 10N.
FIG. 10P shows a further enlarged portion of said seventh embodiment according to P in FIG. 10O.

FIG. 10N shows a fourth square grating having sides of 100 μm. An enlarged portion thereof according to the dotted square indicated by O is shown in FIG. 10O and an enlarged portion according to the dotted square indicated by P is shown in FIG. 10P. This second square grating and the first square grating according to FIGS. 10K-10M have the same specifications, except that the second square grating is aligned with respect to the axes X and Y. The rectangular holes are rotated by 45° with respect to the axes X and Y.

Figure 11A:
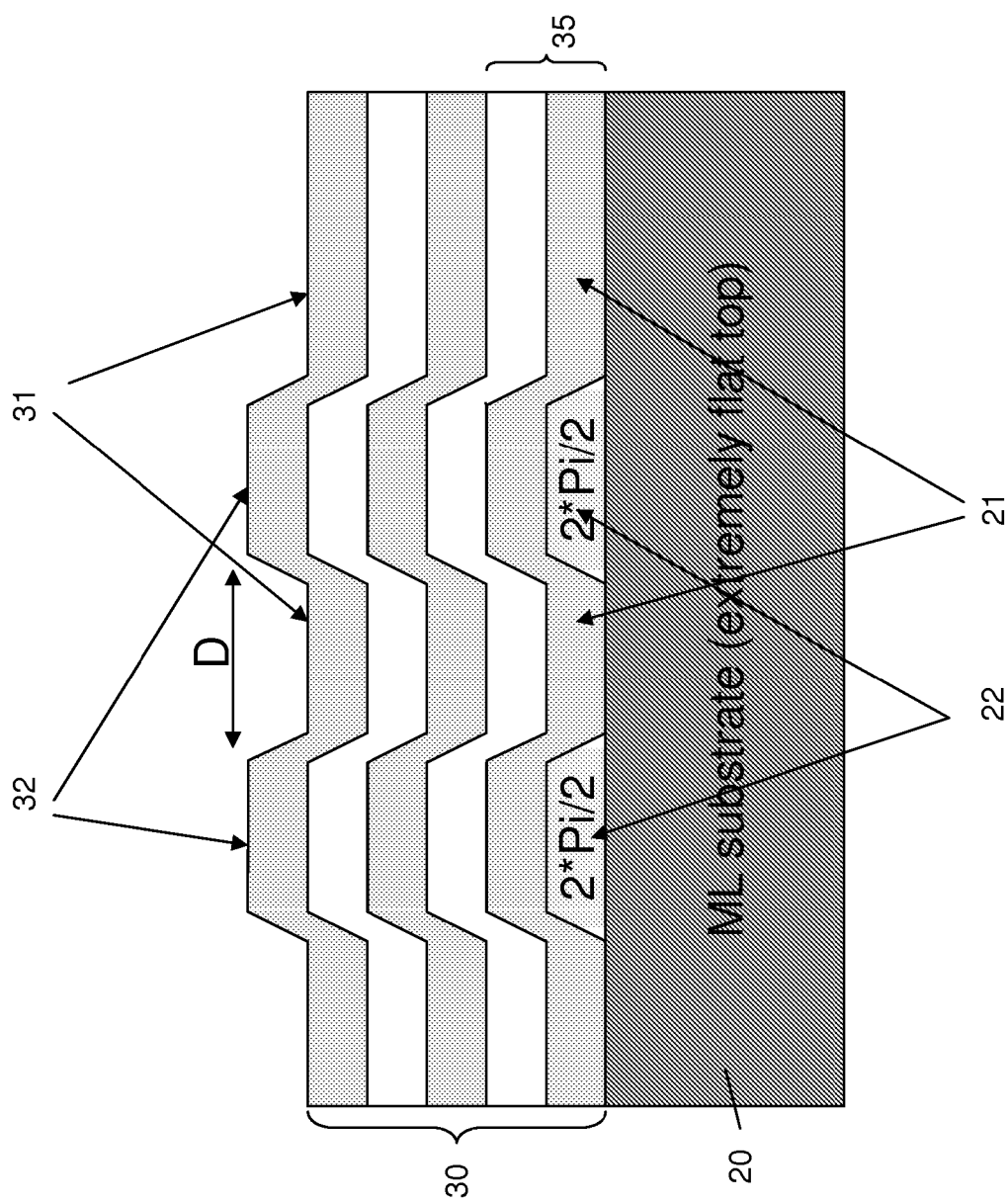
FIGS. 11A and 11B show stages in a method for manufacturing a grating according to an embodiment of the invention.
Figure 11B:
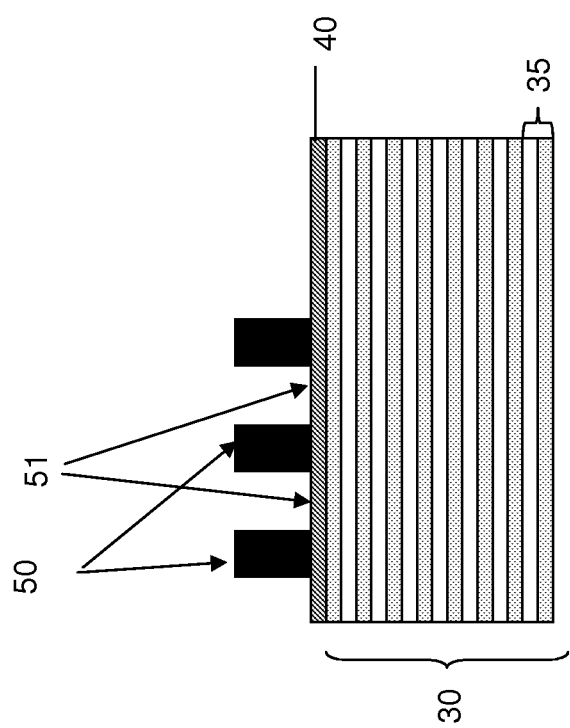

FIGS. 11A and 11B illustrate an embodiment of a method for manufacturing a grating for EUV-radiation. According to this method, a flat substrate 20 is provided, as shown in FIG. 11A. The substrate 20 is provided, for example, with a stack of bi-layers, wherein the two components in each bi-layer have respective etching agents. The bi-layers may be formed from a combination of Cr, Si and Mo, or other materials, provided that they do not destruct the substrate. With each etching step, the substrate is etched with one layer at a time, so that an accurate height pattern can be formed at the surface of the substrate. In this way a patterned substrate may be provided that has first locations 21 and second locations 22. The first locations 21 and the second locations 22 have a mutual height difference.

A Bragg-reflector 30 for the EUV-radiation may then be applied at the patterned substrate. The Bragg-reflector 30 comprises a plurality, e.g. 40 to 50, suitable bi-layers 35, for example Mo/Si layers or Mo/Be layers. The bilayers 35 may have a thickness of half the wave-length of the EUV-radiation, for example a thickness of 7 nm. The bilayers 35 may be applied by any suitable method, such as vapor deposition.

The structure formed by the first and second locations 21, 22 in the patterned substrate 20 propagates into the stack of bi-layers 35, and provide for a deflection of the EUV beam. The Distance D between the structures determines the apparent deflection angle of the EUV beam.

FIG. 11B shows a further stage in the manufacturing of the grating. For clarity, the pattern formed and illustrated in FIG. 11A is not shown. As shown in FIG. 11B, the stack 30 of bilayers 35 may be provided with a protection layer 40, for example to protect the reflector against oxidation. A suitable protection layer 40 may include Ru.

Subsequently, a pattern of lines 50 of an EUV adsorbing material, such as Cr or TaN-based material may be applied at the stack 30 of bilayers 35 by a method known in the art, such as litho-e-beam.

As shown in FIG. 11B, reflecting lines 51 remain between the absorbing lines 50. As shown in FIG. 11A, these reflecting lines are formed of first reflective dots 31 propagated above the first locations 21 in the patterned substrate, and second reflecting dots 32 propagated above the second locations 22 in the patterned substrate 20.

In this example the sub-pattern of dots within the pattern of lines forms an alternating phase-shift mask, i.e., the first and second dots 31, 32 have a substantially equal reflection for EUV-radiation.

An alternative method to provide the pattern of reflecting dots is described in U.S. Pat. No. 6,645,679. As described therein, the stack of bilayers is arranged upon a flat substrate e.g. of a low thermal expansion material (LTEM). The substrate can be a silicon oxynitride (SiON) material. After the stack of bi-layers is provided, a heat mask is provided at the stack. Subsequently, the heat-mask is selectively etched to form a pattern and the stack of bi-layers is selectively heat treated according to the pattern. In this way, a pattern is formed on the stack of first spots having a phase shift of 0 degrees and a high reflectance and second spots having a phase shift of 180 degrees and having a relatively low reflectance.

According an embodiment, a pattern of lines of an EUV adsorbing material may be subsequently made at the surface of the patterned stack of bi-layers, such as Cr at the multilayer. The pattern of lines may be applied by e-beam writing. In this way, a resulting pattern may be obtained having first, EUV-absorbing lines alternated by second lines having a sub-pattern formed by the first highly-reflective and second lowly reflective spots. If desired, the second lines may be provided with EUV-absorbing zones. In this way, an alternative degree of freedom may be obtained to shape the diffraction pattern caused by the sub-pattern.

Figure 12:
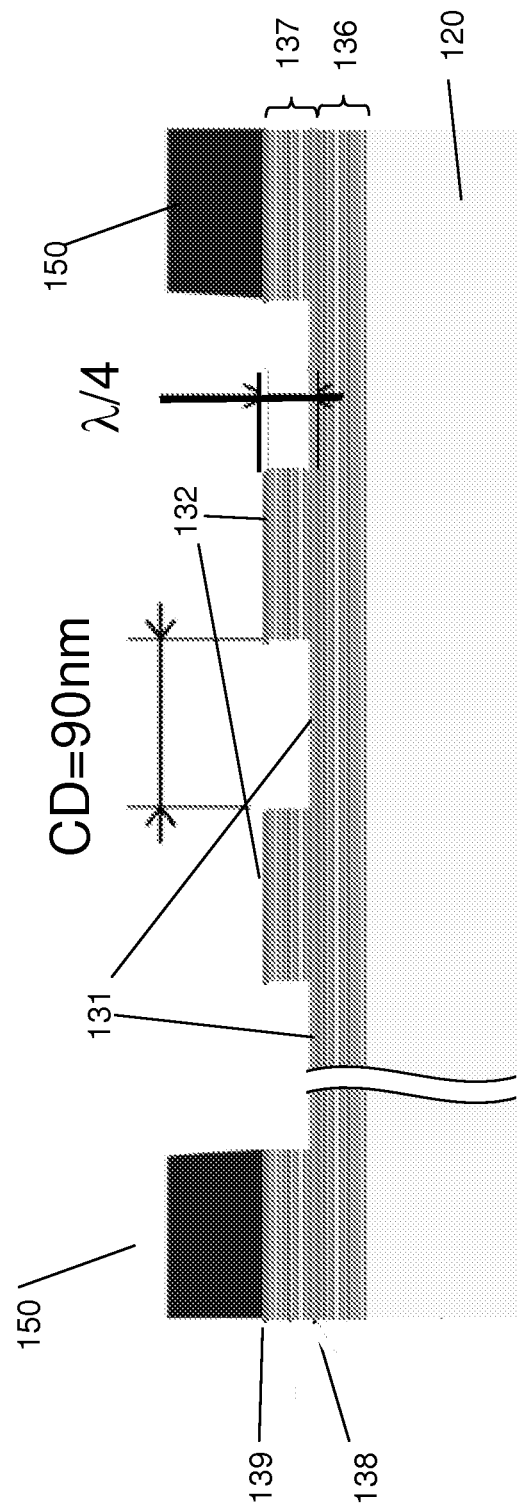
FIG. 12 shows a first grating according to an embodiment of the present invention that may be obtained with an alternative method.

FIG. 12 shows a grating that may be obtained by an embodiment. Parts therein corresponding to FIGS. 11A and 11B have a reference number that is 100 higher. The grating shown in FIG. 12 has a substrate 120 of low thermal expansion material. A first multilayer reflector 136 may be applied on the substrate 120, for example by depositing a plurality, e.g. 40 to 50 suitable bi-layers, for example Mo/Si layers or Mo/Be layer. The first reflector 136 may be provided with a combined capping/etch stop layer 138. On top of the etch stop layer 138 a second reflector 137 may be applied. The second reflector 137 may be provided with a combined capping/etch stop layer 139. On top of the etch stop layer 139, an EUV absorbing layer may be applied. The effective thickness of the stack formed by second reflector 137 and further etch stop layer 139 is λ/4. The bilayer thickness of the second reflector is tailored so as to match the reflectances of the stacked reflectors 136, 138, 137, 139 and the first reflector 136, 138 alone. The second reflector 137 and the absorber 150 are selectively etched in a way known to obtain a pattern of first dots 132 reflecting with a phase shift of 0 deg and second dots 131 reflecting with a phase shift of 180 deg as shown for example in FIG. 8B. Finally, the absorbing material 150 is selectively etched to obtain a pattern of lines, as shown for example in FIG. 8A.

Figure 13:
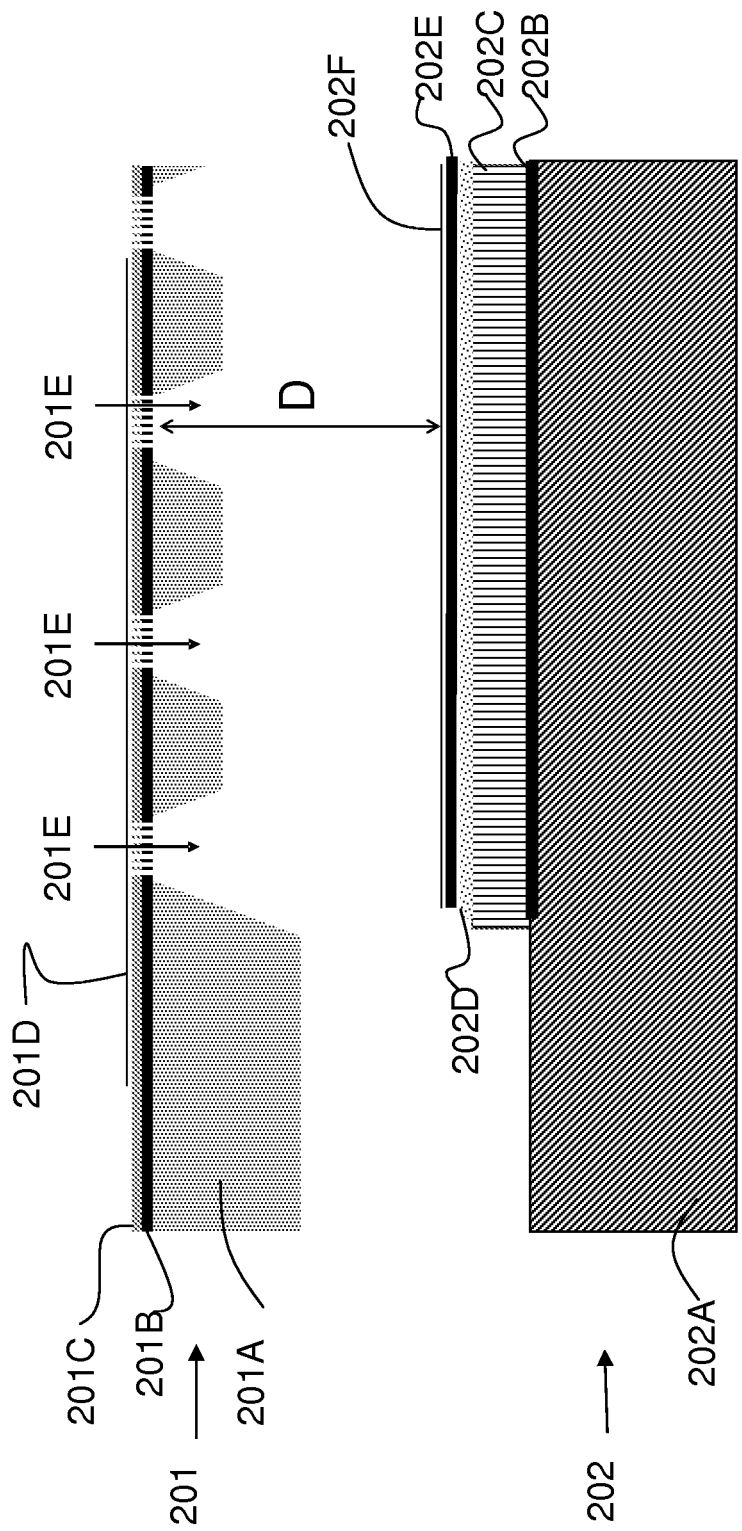
FIG. 13 shows a cross section of an embodiment of grating and detector in more detail.

FIG. 13 shows a cross section of an embodiment of the grating 201 and a CCD-detector 202 in more detail. The grating 201 is formed as a layered structure comprising a wafer 201A of silicon. Alternatively another material like sheet metal or a ceramic material such as Si3N4 may be used. The wafer has a thickness of at least 0.1 mm. For practical purposes the wafer is not thicker than 1 cm. In this embodiment the thickness of the wafer is 0.675 mm. The wafer 201A is provided with a stiff foil 201B of a ceramic material such as Si3N4 or SiC or a metal like titanium and having a thickness in the range of at most 100 nm. The foil 201B, here of Si3N4 and having a thickness of 50 nm, is covered with a patterned absorber layer 201C. A material for this layer 201C, having good absorbing properties is nickel. A thickness of 50 nm provides for sufficient absorption. In the embodiment shown however a layer 201C of Cr, is used, as the material can be easily patterned. The layer 201C has a thickness of 120 nm to provide for sufficient absorption. Where the absorbing layer 201C has openings, the membrane 201B is etched through (real holes). Although various options are possible for the pattern, such as a checkerboard pattern, a pattern with hexagonal openings, a pattern of circular pinholes 201E, for example as shown in FIG. 10D is preferred. Such a pattern is particularly favorable for a good heat-transfer and for a good strength, and facilitates cleaning of the grating 201, as described with reference to FIG. 14C. The substrate 201A has a pattern approximately conformal to that of the membrane 201B, so that it mechanically supports the membrane 201B in areas between the openings 201E, and therewith contributes to the stiffness of the grating. The layered structure is provided with a Ruthenium protection layer 201D to allow cleaning of the layered structure. Alternative materials are Si3N4, Cr and TiN. The protection layer 201D typically has a thickness in the range of 5 to 10 nm, e.g. 7.5 nm.

FIGS. 14 A-C illustrates the consequences of the structure of the grating 201 for the effort necessary for cleaning.

In FIG. 14C parts corresponding to those in FIG. 13 have the same reference number. In FIGS. 14A and 14B parts corresponding to those in FIG. 13 have a reference number that is 300 higher.

FIG. 14A shows a grating 501 having a closed foil 501B. As shown therein carbon 501F deposits on both sides of the grating during use thereof. This carbon deposition reduces transmission of the grating, and therewith inhibits its functionality. A cleaning method illustrated in FIG. 2B may be used, wherein the grating is exposed to hydrogen radicals H*. The hydrogen radicals H* react with the deposited carbon and the reaction products CxHx evaporate. Although this process results in a clean upper surface of the grating 501, the carbon 501F deposited at the bottom is not removed in this way. In order to provide for bottom cleaning with H* a H* source would be needed inside the sensor. However, as such a source entails a high heat production, it could not be implemented without introducing cooling means and therewith substantially increasing the volume of the detector. As H* has a high recombination-ratio of H* into H2 hardly no H* reaches the bottom of the grating 501.

FIG. 14C shows a part of a grating 201 according to the present invention. Due to the presence of the openings 201E, the hydrogen radicals can reach both sides of the grating and therewith remove substantially all deposited carbon.

FIG. 15A schematically shows a top view of a grating 201, ideally having square openings 201E, indicated in black. As is shown in more detail in FIG. 15B, in practice the openings will show a corner rounding, see within dotted circle 201E. The grating of FIGS. 15A and 15B has a bad force distribution as the corner-roundings form points of a large shear force. On the other hand this arrangement is advantageous in that it allows for simple e-beaming, i.e. shaped electron beaming and the Zernike offset can be solved with a rotated version.

FIG. 15C shows an alternative arrangement, wherein the grating 301 has circular openings 301E. This is advantageous, as this results in a significantly smoother stress distribution. However, as compared to the embodiment shown in FIGS. 15A and 15B, this arrangement is more difficult to manufacture by e-beaming.

At a distance D of 10 mm from the grating 201, a camera 202 is located. In the embodiment shown, the camera, comprises a COMS camera chip 202B mounted at a printed circuit board 202A. At a side facing towards the grating 201 the camera chip 202B is provided with a fiber optic plate. The fiber optic plate 202C enables deposition of further layers, in that it protects the camera 202B during the deposition of the further layers. As the fiber optic plate 202C is composed of "vertical fibers" i.e. fibers that are arranged transverse to the surface of the camera chip 202B it hardly influences imaging capability. A first layer deposited on the fiber optic plate 202C is a layer 202D of scintillating material. The layer 202 converts the UV-radiation into a wavelength for which the camera chip 202B has a good sensitivity. The scintillating material is for example P43 of YAG:Ce. The layer 202D is covered with a layer 202E of zirconium having a thickness of 50 nm, that functions as a spectral purity filter. Although any other material serving as a spectral purity filter is suitable, a layers of Zr or Si is preferred. Dependent on the required suppression of non-EUV wavelengths, the thickness of the layer 202E may be varied between 10 and 100 nm. A thickness less than 10 nm would generally have a too low suppression of the non-EUV wavelengths, and a layer having a thickness higher than 100 nm will generally also suppress radiation in the EUV wavelength range too much. The stack formed by layers 202A-202E is provided with a layer 202F of Ruthenium as cleaning-resilience-layer. Typically the layer has a thickness in a range of 5 to 10 nm. The layer should be vacuum compatible, hence have low outgassing characteristics and should further have a relatively low absorption. Apart from ruthenium, other materials like TiN and CrN may be used for this layer.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. A grating for EUV radiation, comprising
a patterned substrate having first locations and second locations spread between each other, the first locations and the second locations having a mutual height difference;
a plurality of reflecting lines, each reflecting line comprising a plurality of first reflecting dots, and a plurality of second reflecting dots arranged between each other, wherein the first reflecting dots and the second reflecting dots are configured to reflect EUV-radiation with a mutual phase difference of 180±10 degrees mod 360 degrees;
a multilayer configured to form a Bragg-reflector for the EUV-radiation at the patterned substrate, the pattern of first locations and the second locations at the substrate being propagated into a surface of the Bragg reflector as the first reflecting dots and the second reflecting dots, respectively; and
a pattern of lines made of an EUV adsorbing material at the multilayer configured to delimitate reflecting lines formed by the surface of the multilayer.

2. A grating according to claim 1, wherein the first reflecting dots and the second reflecting dots within the reflecting lines are separated by absorbing portions.

3. A grating according to claim 1, wherein the first reflecting dots and the second reflecting dots completely fill the area within the reflecting lines.

4. A grating according to claim 1, wherein the first reflecting dots and/or the second reflecting dots are between 50 nm and 150 nm in diameter.

5. A grating according to claim 4, wherein the first reflecting dots and/or the second reflecting dots are between 70 nm and 120 nm in diameter.

6. A grating according to claim 1, wherein the first reflecting dots and the second reflecting dots are arranged in a random pattern within each line.

7. A grating according to claim 1, wherein the first reflecting dots and the second reflecting dots are arranged in a regular pattern within each line.

8. A grating according to claim 1, wherein the plurality of reflecting lines are arranged in two orthogonal directions.

9. A grating according to claim 1, wherein the plurality of reflecting lines are arranged as a checkerboard grating.

10. A grating according to claim 1, wherein each of the plurality of reflecting lines has a width in the range of 1 µm to 10 µm.

11. A grating comprising
a substrate;
a first multilayer reflector on said substrate;
a patterned second multilayer reflector on the first multilayer reflector, the first multilayer reflector and the second multilayer reflector being configured to form a reflecting surface;
a plurality of reflecting lines, each reflecting line comprising a plurality of first reflecting dots, and a plurality of second reflecting dots arranged between each other, wherein the first reflecting dots and the second reflecting dots are configured to reflect EUV-radiation with a mutual phase difference of 180±10 degrees mod 360 degrees, wherein the first reflecting dots are formed by the second multilayer reflector and the second reflecting dots are formed by the first multilayer reflector; and
a pattern of reflecting lines formed at said surface, the reflecting lines being separated by lines of absorbing material at said surface.

12. A grating according to claim 11, wherein the first reflecting dots and the second reflecting dots within the reflecting lines are separated by absorbing portions.

13. A grating according to claim 11, wherein the first reflecting dots and the second reflecting dots completely fill the area within the reflecting lines.

14. A grating according to claim 11, wherein the first reflecting dots and/or the second reflecting dots are between 50 nm and 150 nm in diameter.

15. A grating according to claim 14, wherein the first reflecting dots and/or the second reflecting dots are between 70 nm and 120 nm in diameter.

16. A grating according to claim 11, wherein the first reflecting dots and the second reflecting dots are arranged in a random pattern within each line.

17. A grating according to claim 11, wherein the first reflecting dots and the second reflecting dots are arranged in a regular pattern within each line.

18. A grating according to claim 11, wherein the plurality of reflecting lines are arranged in two orthogonal directions.

19. A grating according to claim 11, wherein the plurality of reflecting lines are arranged as a checkerboard grating.

20. A grating according to claim 11, wherein each of the plurality of reflecting lines has a width in the range of 1 µm to 10 µm.

* * * * *